United States Patent
Kropelnicki et al.

(10) Patent No.: US 10,903,262 B2
(45) Date of Patent: Jan. 26, 2021

(54) SCALABLE THERMOELECTRIC-BASED INFRARED DETECTOR

(71) Applicant: Meridian Innovation Pte Ltd, Singapore (SG)

(72) Inventors: Piotr Kropelnicki, Singapore (SG); Ilker Ender Ocak, Singapore (SG); Paul Simon Pontin, Singapore (SG)

(73) Assignee: Meridian Innovation Pte Ltd, Singapore (SG)

(*) Notice: Subject to any disclaimer, the term of this patent is extended or adjusted under 35 U.S.C. 154(b) by 0 days.

(21) Appl. No.: 16/517,653

(22) Filed: Jul. 21, 2019

(65) Prior Publication Data
US 2019/0341419 A1 Nov. 7, 2019

Related U.S. Application Data

(63) Continuation of application No. 15/647,284, filed on Jul. 12, 2017, now Pat. No. 10,403,674.

(51) Int. Cl.
*H01L 27/146* (2006.01)
*G01J 5/04* (2006.01)
(Continued)

(52) U.S. Cl.
CPC .......... *H01L 27/14669* (2013.01); *B81C 1/00* (2013.01); *G01J 5/024* (2013.01);
(Continued)

(58) Field of Classification Search
CPC .... G01J 2005/123; G01J 5/0225; G01J 5/024; G01J 5/046; G01J 5/048; G01J 5/0853;
(Continued)

(56) References Cited

U.S. PATENT DOCUMENTS 5,544,001 A * 8/1996 Ichiya ............... H01H 59/0009
200/181
6,335,478 B1 1/2002 Chou et al.
(Continued)

FOREIGN PATENT DOCUMENTS

CN 104501970 A 4/2015
CN 106744656 A 5/2017
(Continued)

OTHER PUBLICATIONS

J. H. Smith et al., Embedded Micromechanical Devices for the Monolithic Integration of MEMS with CMOS, IEEE International Electron Devices Meeting, Dec. 10-13, 1995, pp. 1-5, Sandia National Labs., Albuquerque, New Mexico, U.S.A.
(Continued)

*Primary Examiner* — Long K Tran
(74) *Attorney, Agent, or Firm* — Horizon IP Pte Ltd.

(57) ABSTRACT

Device and method of forming the device are disclosed. The method includes providing a substrate prepared with a complementary metal oxide semiconductor (CMOS) region and a sensor region. A substrate cavity is formed in the substrate in the sensor region, the substrate cavity including cavity sidewalls and cavity bottom surface and a membrane which serves as a substrate cavity top surface. The cavity bottom surface includes a reflector. The method also includes forming CMOS devices in the CMOS region, forming a micro-electrical mechanical system (MEMS) component on the membrane, and forming a back-end-of-line (BEOL) dielectric disposed on the substrate having a plurality of interlayer dielectric (ILD) layers. The BEOL dielectric includes an opening to expose the MEMS component. The opening forms a BEOL cavity above the MEMS component.

20 Claims, 19 Drawing Sheets

(51) Int. Cl.

| | |
|---|---|
| *G01J 5/12* | (2006.01) |
| *G01J 5/02* | (2006.01) |
| *B81C 1/00* | (2006.01) |
| *G01J 5/08* | (2006.01) |
| *G01J 5/16* | (2006.01) |
| *H01L 31/0224* | (2006.01) |
| *H01L 31/09* | (2006.01) |

(52) U.S. Cl.
CPC ............ *G01J 5/0225* (2013.01); *G01J 5/046* (2013.01); *G01J 5/048* (2013.01); *G01J 5/0853* (2013.01); *G01J 5/12* (2013.01); *G01J 5/16* (2013.01); *H01L 27/146* (2013.01); *H01L 27/14612* (2013.01); *H01L 27/14629* (2013.01); *H01L 27/14643* (2013.01); *H01L 27/14649* (2013.01); *H01L 31/0224* (2013.01); *H01L 31/09* (2013.01); *G01J 2005/123* (2013.01)

(58) Field of Classification Search
CPC .... G01J 5/12; H01L 27/146; H01L 27/14612; H01L 27/14629; H01L 27/14643; H01L 27/14649; H01L 27/14669; H01L 31/0224; H01L 31/09
USPC .......................................................... 257/665
See application file for complete search history.

(56) References Cited

U.S. PATENT DOCUMENTS

| | | | |
|---|---|---|---|
| 6,803,250 B1 | 10/2004 | Yaung et al. | |
| 7,755,048 B2 | 7/2010 | Hsu | |
| 9,324,760 B2 | 4/2016 | Vasseur et al. | |
| 9,330,856 B2* | 5/2016 | Herrin .................. | H01H 1/0036 |
| 9,505,611 B1 | 11/2016 | Liu et al. | |
| 9,577,001 B2 | 2/2017 | Enichlmair et al. | |
| 2007/0057343 A1 | 3/2007 | Chinthakindi et al. | |
| 2008/0142912 A1 | 6/2008 | Inaba et al. | |
| 2008/0216883 A1 | 9/2008 | Leneke et al. | |
| 2009/0243004 A1 | 10/2009 | Lan et al. | |
| 2009/0253004 A1* | 10/2009 | Ozeki ............... | H01M 8/04373 429/436 |
| 2010/0031992 A1 | 2/2010 | Hsu | |
| 2010/0181484 A1 | 7/2010 | Inada et al. | |
| 2010/0243892 A1 | 9/2010 | Dupont | |
| 2011/0147869 A1 | 6/2011 | Lazarov et al. | |
| 2012/0061569 A1 | 3/2012 | Noguchi | |
| 2012/0097415 A1 | 4/2012 | Reinert et al. | |
| 2013/0234270 A1 | 9/2013 | Yama et al. | |
| 2015/0076651 A1 | 3/2015 | Noguchi | |
| 2015/0168221 A1 | 6/2015 | Mao et al. | |
| 2015/0177069 A1 | 6/2015 | Maes et al. | |
| 2015/0210540 A1 | 7/2015 | Sadaka et al. | |
| 2015/0321905 A1 | 11/2015 | Gooch et al. | |
| 2016/0079306 A1 | 3/2016 | Kropelnicki et al. | |
| 2016/0214855 A1 | 7/2016 | Yeh et al. | |
| 2016/0264402 A1 | 9/2016 | Yu et al. | |
| 2016/0289063 A1 | 10/2016 | Ocak et al. | |
| 2016/0318758 A1 | 11/2016 | Chou et al. | |
| 2016/0332867 A1 | 11/2016 | Tseng et al. | |
| 2016/0379961 A1 | 12/2016 | Lee et al. | |
| 2017/0107097 A1 | 4/2017 | Cheng et al. | |
| 2017/0179119 A1 | 6/2017 | Chang et al. | |
| 2018/0257927 A1 | 9/2018 | Rothberg et al. | |
| 2019/0027522 A1 | 1/2019 | Kropelnicki et al. | |

FOREIGN PATENT DOCUMENTS

| | | |
|---|---|---|
| EP | 2105963 A2 | 9/2009 |
| EP | 2264765 A1 | 12/2010 |
| TW | 201339544 A | 10/2013 |
| WO | 2014100706 A1 | 6/2014 |

OTHER PUBLICATIONS

A Graf et al, Review of micromachined thermopiles for infrared detection, Measurement Science and Technology, Jul. 1, 2007, pp. R59-R75, vol. 18, No. 7, IOP Publishing, Bristol, GB.

* cited by examiner

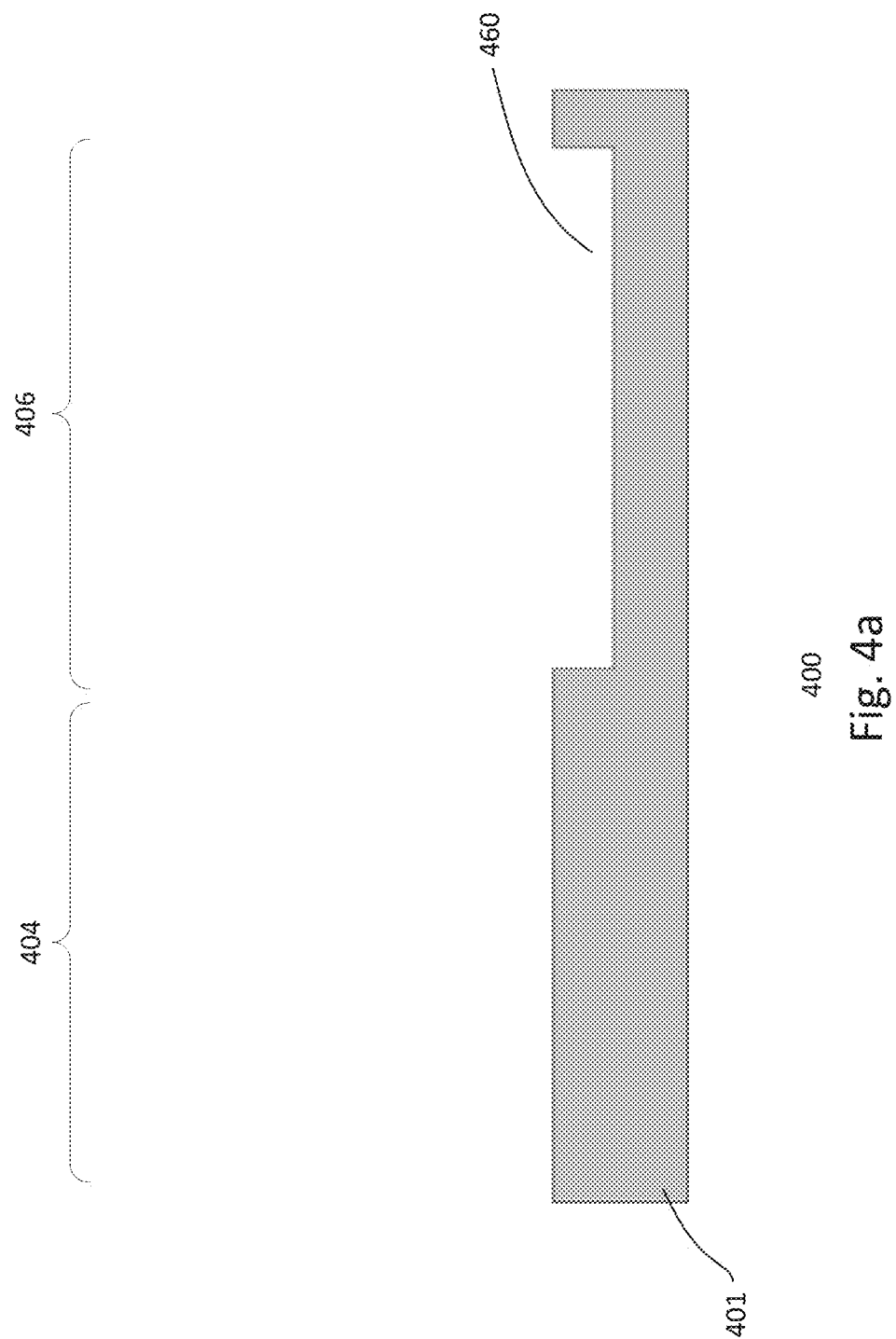

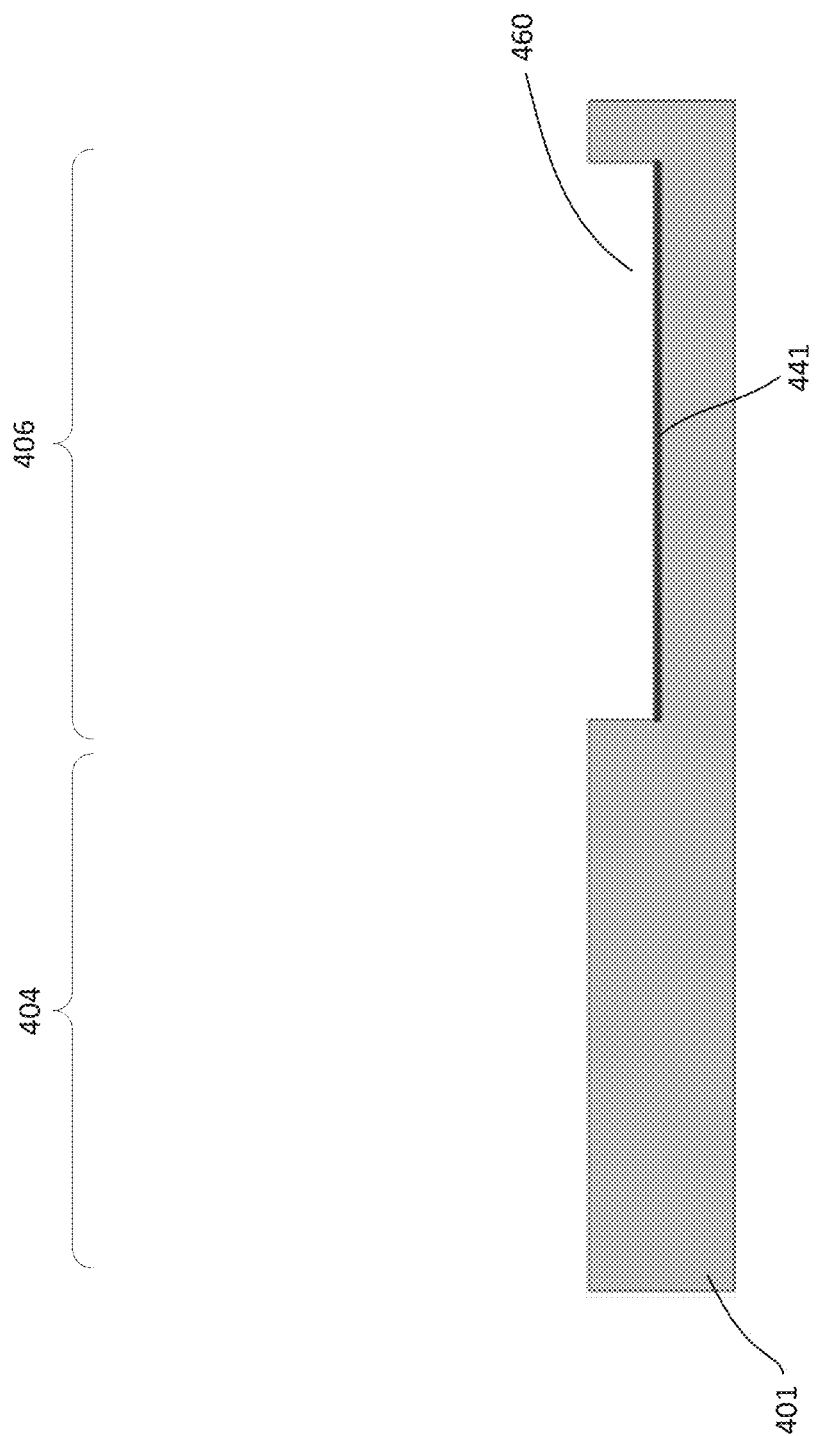

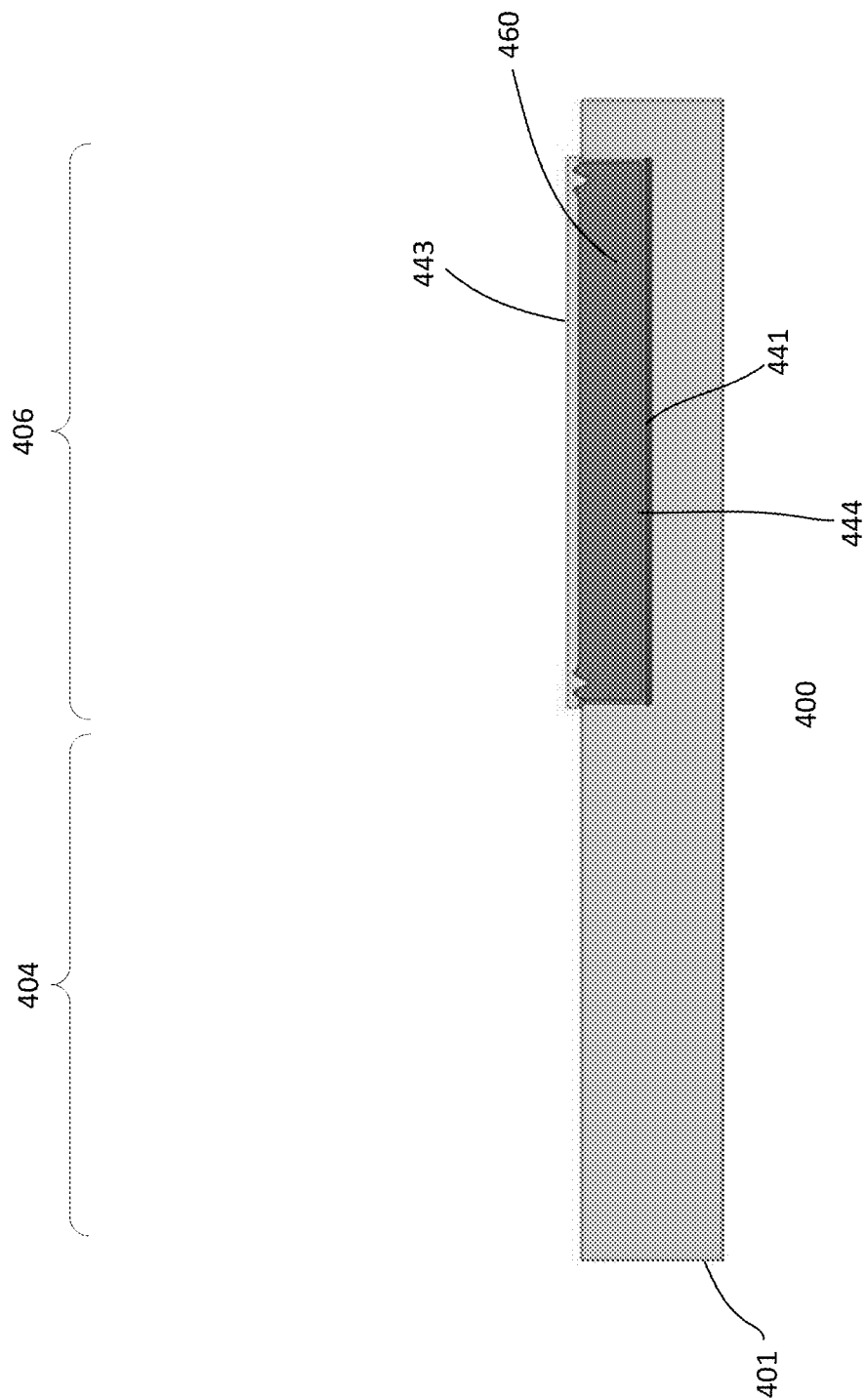

SCALABLE THERMOELECTRIC-BASED INFRARED DETECTOR

CROSS-REFERENCE TO RELATED APPLICATIONS

This application is a continuation application which claims benefit of co-pending U.S. patent application Ser. No. 15/647,284, filed on Jul. 12, 2017. This application cross-references to U.S. patent application Ser. No. 16/224,782, filed on Dec. 18, 2018, which is a divisional application of U.S. patent application Ser. No. 15/653,558, now U.S. Pat. No. 10,199,424, filed on Jul. 19, 2017, the disclosure of which is herein incorporated by reference in their entireties for all purposes.

BACKGROUND

The demand for uncooled infrared detectors is continually growing due to the increased demand from numerous applications. These applications, just to name a few, include air conditioning systems, handphones, autonomous driving cars, internet of things (IoT), fire-fighting and traffic safety. Furthermore, it is expected that there will be numerous more applications in the near future.

Conventional uncooled infrared detectors have been implemented using microbolometers. However, microbolometers require mechanical components for calibration purposes. As an example, microbolometers require mechanical shutters for offset correction. The required mechanical components for microbolometers increases manufacturing complexity. Such complexity increases cost. In addition, the need for mechanical components for microbolometer makes it difficult to produce small or compact devices.

The present disclosure is directed to cost effective and compact infrared detectors.

SUMMARY

Embodiments of the present disclosure generally relate to device and method of forming thereof. In one embodiment, the method includes providing a substrate prepared with a complementary metal oxide semiconductor (CMOS) region and a sensor region. A substrate cavity is formed in the substrate in the sensor region, the substrate cavity including cavity sidewalls and cavity bottom surface and a membrane which serves as a substrate cavity top surface. The cavity bottom surface includes a reflector. The method also includes forming CMOS devices in the CMOS region, forming a micro-electrical mechanical system (MEMS) component on the membrane, and forming a back-end-of-line (BEOL) dielectric disposed on the substrate having a plurality of interlayer dielectric (ILD) layers. The BEOL dielectric includes an opening to expose the MEMS component. The opening forms a BEOL cavity above the MEMS component.

In another embodiment, a device includes a substrate with a complementary metal oxide semiconductor (CMOS) region and a sensor region. The device also includes CMOS devices in the CMOS region and a substrate cavity in the substrate in the sensor region. The substrate cavity includes cavity sidewalls and cavity bottom surface and a membrane which serves as a substrate cavity top surface. The cavity bottom surface includes a reflector. A micro-electrical mechanical system (MEMS) component is disposed on the membrane. A back-end-of-line (BEOL) dielectric is disposed on the substrate having a plurality of interlayer dielectric (ILD) layers with contacts and metal interconnects. The BEOL dielectric includes an opening to expose the MEMS component. The opening forms a BEOL cavity above the MEMS component.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 4a-4l show cross-sectional views of an exemplary process for forming a device.

DETAILED DESCRIPTION

Embodiments generally relate to devices, for example, semiconductor devices or integrated circuits (ICs) with thermoelectric-based infrared detectors. The IC, for example, is a complementary metal oxide semiconductor (CMOS) device. As for the infrared detector or sensor, it is, for example, a micro-electrical mechanical system (MEMS). The MEMS detector is embedded into the IC. Furthermore, the MEMS detector is compatible with CMOS processing. The devices can be incorporated into products, such as thermal imagers. For example, a device may include a plurality of MEMS sensors which can be configured to form a sensor array for a thermal imager. The sensors may be used for other types of applications, such as single pixel or line array temperature or motion sensors.

The fabrication of devices may involve the formation of features on a substrate that makes up circuit components, such as transistors, resistors, capacitors and MEMS sensors. The components are interconnected, enabling the device to perform the desired functions. To form the features and interconnections, layers are repeatedly deposited on the substrate and patterned as desired using lithographic techniques. For example, a wafer is patterned by exposing a photoresist layer with an exposure source using a reticle containing the desired pattern. After exposure, the photoresist layer is developed, transferring the pattern of the reticle to the photoresist layer. This forms a photoresist etch mask. An etch is performed using the etch mask to replicate the pattern on the wafer below, which may include one or more layers, depending on the stage of the process. In the formation of the devices, numerous reticles may be used for different patterning processes. Furthermore, a plurality of devices may be formed on the wafer in parallel.

Figure 1:
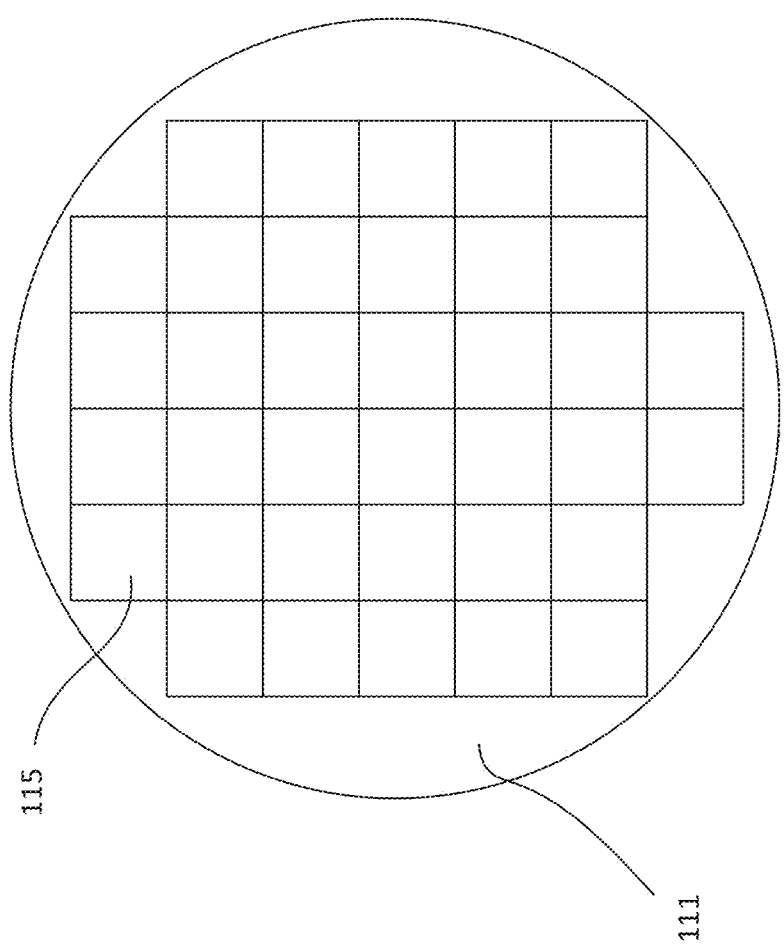
FIG. 1 shows a top view of a semiconductor wafer.

FIG. 1 shows a simplified plan view of an embodiment of a semiconductor wafer 101. The semiconductor wafer, for example, may be a silicon wafer. The wafer may be a lightly doped p-type wafer. Other types of wafers, such as siliconon-insulator (SOI), or silicon germanium wafer, as well as wafers doped with other types of dopants or dopant concentrations, may also be useful.

The wafer includes an active surface 111 on which a device 115 is formed. A plurality of devices may be formed on the wafer in parallel. The devices, for example, are arranged in rows along a first (x) direction and columns along a second (y) direction. Separating the devices are dicing channels. After processing is completed, the wafer is diced along the dicing channels to singulate the devices into individual chips.

Figure 2:
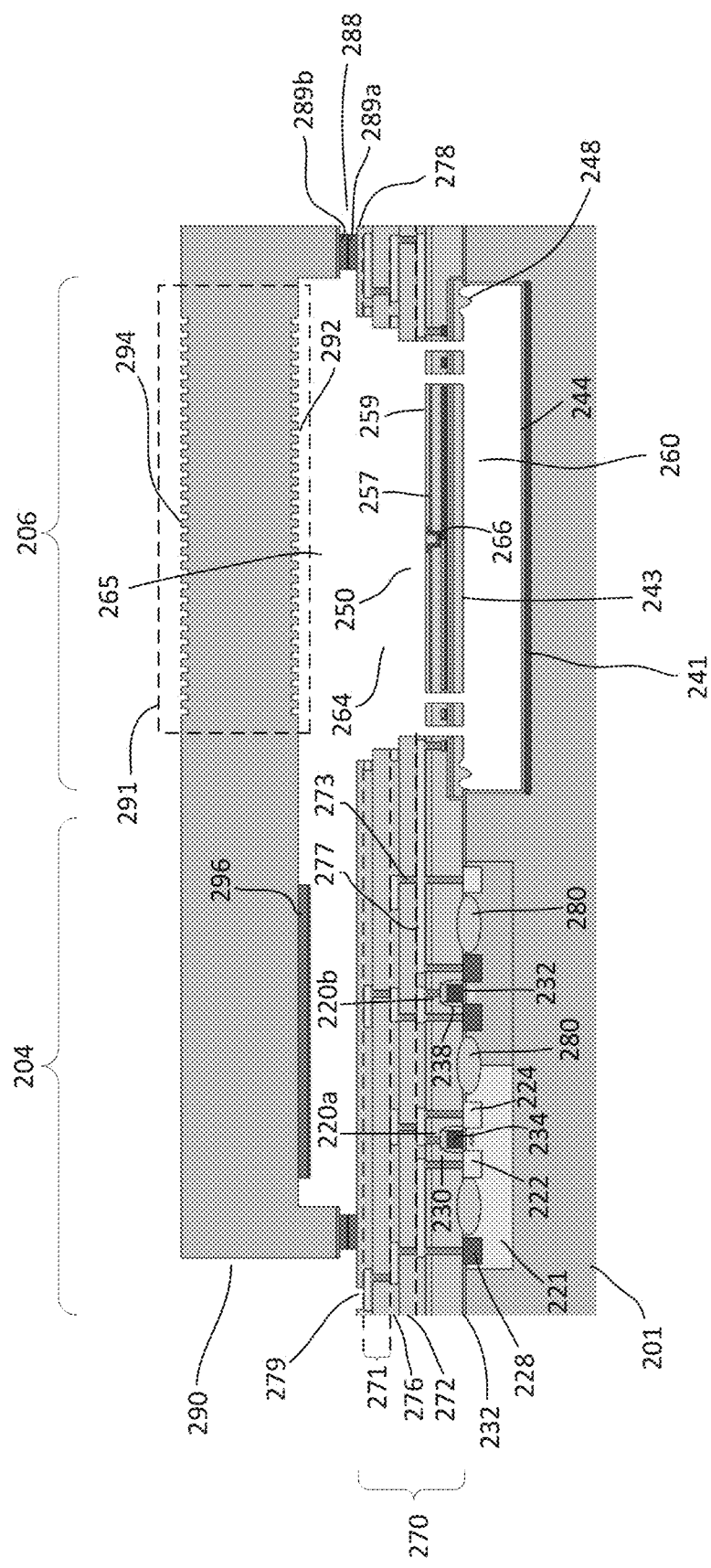
FIG. 2 shows simplified cross-sectional views of embodiments of a device.

FIG. 2 shows simplified cross-sectional views of embodiments of a device 115. The device, for example, is a CMOS device with an embedded MEMS structure or component. In one embodiment, the device is a CMOS device embedded with a thermoelectric-based infrared sensor or detector. In some embodiments, the MEMS structure of the device includes a plurality of thermoelectric-based infrared sensors. The plurality of sensors may be configured to form a sensor array. For example, the device may be an infrared imager in which each sensor may be a pixel of an infrared imager. Other types of MEMS structures or applications may also be useful. The device, for example, may be formed in parallel with other devices on a wafer and subsequently singulated. The device includes a substrate 201. The device, for example, may be a part of the wafer, as described in FIG. 1. Common elements may not be described or described in detail. The substrate, for example, may be a semiconductor substrate, such as a silicon substrate. The substrate, for example, may be a lightly doped p-type silicon substrate. Other types of substrates or wafers may also be useful.

In one embodiment, the substrate includes first and second device regions 204 and 206. The first region is a CMOS region while the second region is a sensor region. The CMOS region includes CMOS components and the sensor region includes a MEMS structure or component. As shown, the CMOS region includes first and second CMOS components 220a and 220b. The CMOS components include metal oxide semiconductor (MOS) transistors. For example, the first CMOS component is an n-type MOS transistor and the second CMOS component is a p-type MOS transistor. P-type MOS transistors and n-type MOS transistors are complementary types of transistors. A transistor includes a device well 221. The device well serves as a body of the transistor. Additionally, a transistor includes a gate 230 disposed on the substrate over the device well between first and second source/drain (S/D) regions 222 and 224 disposed in the device well.

The gate of the transistor may include a gate electrode 234 over a gate dielectric 232. The gate electrode may be polysilicon and the gate dielectric may be thermal silicon oxide. Other types of materials or configurations of gates may also be useful. For a p-type MOS transistor, the device well is an n-type well and the S/D regions are heavily doped p-type regions. On the other hand, an n-type transistor has a p-type device well and heavily doped n-type S/D regions. The S/D regions may include lightly doped extension regions. The lightly doped extension regions are lightly doped with the same polarity type dopants as the heavily doped S/D regions. The sidewalls of the gate may include dielectric spacers 238. The spacers facilitate aligning the S/D and lightly doped extension regions. A device well may include a device well contact 228 which is heavily doped with the same polarity type dopants as the device well.

The CMOS region, as shown, may be a logic region which includes first and second transistors. However, the logic region may include numerous transistors. In addition, the logic region may include regions for transistors having different operating characteristics or voltages. For example, low voltage transistors may be provided in low voltage (LV) region, intermediate or medium voltage transistors may be provided in a medium voltage (MV) region and high voltage transistors may be provided in a high voltage (HV) region. Other types of device regions may also be included. For example, a memory region may be included in which a memory array is disposed.

As discussed, the device may include a sensor array with a plurality of sensors arranged in a matrix with rows and columns of sensors. Each sensor corresponds to a pixel of an array of pixels. In such case, the CMOS components may include select switches, row and column decoders and readout circuits. Other CMOS components may also be included. The CMOS components are configured to read out each pixel of the array. Once the full array of sensors is read out, an image may be reconstructed. The image, for example, is one frame corresponding to the sensors of the array.

Isolation regions 280 are provided to isolate the component regions. For example, isolation regions are provided to isolate the first and second transistor regions as well. In addition, isolation regions may be provided to isolate a device well contact from an S/D region. The isolation regions may be field oxide (FOX) isolation regions. Other types of isolation regions, such as shallow trench isolation (STI) regions may also be useful.

As for the sensor region, it includes a lower sensor cavity 260 disposed in the substrate. In one embodiment, the lower sensor cavity is disposed below the surface of the substrate. For example, the lower sensor cavity is a trench that has been etched into the substrate. The lower sensor cavity may have a square or rectangular footprint or shape. Other shapes for the lower sensor cavity may also be useful. The bottom and sides of the lower sensor cavity are defined by the substrate. As for the top of the lower sensor cavity, it is defined by a dielectric layer 243. The dielectric layer covers the lower sensor cavity. The dielectric layer serves as a membrane for a MEMS structure 250. The dielectric layer may be a silicon oxide layer. Other types of dielectric layers may also be useful.

A reflector 241 is disposed at the bottom of the lower sensor cavity. The reflector reflects infrared radiation. The reflector may be formed from a conductive material. In one embodiment, the reflector is a conductive metal silicide reflector. The metal silicide reflector may be a titanium silicide ($TiSi_x$), a tungsten silicide ($WSi_x$) or an aluminum silicide ($AlSi_x$) reflector. Other types of metal silicide reflectors may also be useful. Alternative types of reflectors may also be useful. For example, the reflector may be a conductive doped reflector layer. The doped reflector layer may be a doped silicon layer, such as a doped polysilicon layer. The doped reflector layer may be heavily doped with p-type or n-type dopants. For example, the dopant concentration of the doped reflector layer may be about $10^{21}$ dopants/cm$^3$. The conductive properties of the surface of the doped region are attributed to the high concentration of dopants being applied, thereby enabling the reflection of the incoming infrared radiation. In other embodiments, the reflector may be a non-conductive reflector, such as a photonic crystal reflector. For example, a photonic crystal layer is formed by etching the surface of the lower sensor cavity. The photonic crystal layer may include a grating pattern configured to reflect incident infrared radiation. For example, different grating patterns of varying depths may be etched from the surface of the photonic crystal layer to adjust the wavelengths and properties of the reflected infrared radiation. Other types of reflectors may also be useful.

A protective liner 244 may be provided. The protective liner, in one embodiment, lines the sidewalls and bottom of the lower sensor cavity, covering the reflector. The protective liner serves to protect the reflector and sidewalls of the lower sensor cavity from subsequent processes. For example, the protective liner serves to protect the reflector from etchants, such as $XeF_2$, used in a release process to form the lower sensor cavity but is being structured and etched away at the CMOS region. In one embodiment, the protective liner is a silicon oxide liner. Other types of liners which are transparent to infrared radiation and are selective to the etchant used in the release process may also be employed. The protective liner, for example, may be less than 200 nm. Any other thicknesses for the protective liner may also be useful.

A dielectric liner 232 may be disposed on the substrate. The dielectric liner covers the substrate, the transistors and the dielectric layer which defines the top of the lower sensor cavity. For example, the portion of the dielectric liner covering the transistors becomes the gate dielectrics and the portion covering the protective liner at the lower sensor cavity acts as an additional protection layer. The dielectric liner may be a silicon nitride or silicon oxide liner. Other types of liners may also be useful. The dielectric liner, for example, may be about 20 nm. Any other thicknesses for the dielectric liner may also be useful.

A MEMS structure 250 is disposed in the sensor region on the dielectric layer which defines the top of the lower sensor cavity. For example, the MEMS structure may be disposed on the liner which lines the dielectric layer defining the top of the lower sensor cavity. The MEMS structure may be a sensor. In one embodiment, the MEMS structure is a thermopile structure which serves as a thermoelectric infrared sensor or detector. Other types of MEMS structures or sensors may also be disposed in the sensor region.

In one embodiment, the thermopile structure includes a thermopile line structure. The thermopile line structure, for example, is a polysilicon line structure doped with thermopile material. Other types of thermopile materials which are stable at high temperatures may also be used as the thermopile line structure. For example, other thermopile materials may include silicon germanium (SiGe), gallium nitride (GaN) or a 2D material, such as graphene, black phosphorus or molysulfide. The thermopile material may be a doped thermopile material. The pattern of the line structure may be a serpentine or meandering line pattern.

In one embodiment, the thermopile line structure includes N line units, where $N \geq 1$. For example, a thermopile line structure may include 1 (N=1) or more (N>1) line units. A line unit includes first and second line segments doped with first and second thermopile dopants. The first thermopile dopants are first polarity type dopants and the second thermopile dopants are second polarity type dopants. The first and second polarity type dopants are opposite polarity type dopants. For example, the first polarity type is p-type and the second polarity type is n-type. The first and second segments, preferably, have about symmetrical lengths. For example, the lengths of the first and second segments have about the same length. This produces about symmetrical heat dissipation between the segments. In some cases, the lengths of the segments may be ±20% of each other. This produces an acceptable difference in heat dissipation between the segments. The doping of the line segments may, for example, be integrated into the S/D doping processes of the p-type and n-type transistors. Alternatively, separate doping processes may be employed to form the doped line segments.

In the case where the line structure includes a single line unit, the segments of the line units are disposed on a line level. For example, the first and second line segments of the line unit are disposed on the same line level over the dielectric layer.

In one embodiment, a metal contact 266 couples the first and second line segments. The metal contact may be disposed at the interface of the first and second line segments. In one embodiment, the metal contact should be a high temperature contact. For example, the contact can sustain subsequent process temperatures. The high temperature metal contact, for example, may be a titanium (Ti) or an aluminum (Al) alloy contact. Other types of high temperature metals may also be used to form the contact. A first thermopile terminal is disposed at a first end of the line structure and a second thermopile terminal is disposed at a second end of the line structure. The terminals may be part of the line structure.

In the case where the line structure includes a multi-line unit line structure (N>1), a line unit of the multi-line unit structure is a stacked line unit. The line units of the multi-line unit line structure are coupled in series. Providing multiple line units to form a sensor improves sensor performance without increasing surface area. In one embodiment, the multi-line structure includes first and second stacked line units (N=2). Providing other numbers of line unit for a line structure may also be useful. For example, a line structure may have 1-4 (N=1-4) line units. Preferably, a line structure has $2^N$ line units, where N=0-2. Other numbers of line unit may also be useful.

In one embodiment, the first and second stacked line units are disposed adjacent to each other on the dielectric layer within the sensor region. A stacked line unit includes a first segment disposed in a first line level and a second line segment disposed in a second line level. The first and second line level may be separated by a dielectric layer. For example, the second line segment of a line unit is overlaid over the first line segment of the line unit and separated by an interline level dielectric layer. A contact connects the first line segment in the first line level to the second line segment in the second line segment.

The first and second line units, as discussed, are coupled in series. For example, a second terminal of the first line unit may be coupled to a first terminal of the second line unit while a first terminal of the first line unit serves as a first terminal of the multi-line unit line structure and a second terminal of the second line unit serves as a second terminal of the multi-line unit line structure. As an example, a line structure with 2 line units may be connected in series to form an n-p-n-p line structure.

The line units of the multi-line unit line structure preferably have similar designs. For example, the line structures have similar patterns with similar line segment lengths which allow for the same cuts through the dielectric layers to the sacrificial layer for an easier release process. Other configurations of line units may also be useful.

In other embodiments, a plurality of line structures may be configured to form an array of line structures. For example, the array may have Y rows and Z columns of line structures, forming a Y×Z array. Each line structure is disposed on the dielectric layer defining the top of the lower sensor cavity. Each line structure corresponds to a pixel. A line structure may have a single line unit or multiple line units. For example, a line structure can have N line units, where N can be greater than 1 or can be equal to 1. The array of line structures may form an infrared imager having Y×Z pixels.

In the case of a polysilicon line structure, it may be formed with one of the polysilicon layers used to form the gate electrodes. For example, the CMOS process may include a gate electrode layer for gate electrodes and may also be employed to also serve as the polysilicon line structure. In the case where the CMOS process includes more than one polysilicon gate electrode layer, the thinner polysilicon gate electrode layer may be preferably selected to serve as polysilicon line structure. In another embodiment, a separate layer may be employed to serve as the line structure. When multiple line structures are stacked, the different stacked structures preferably have the same material and thickness. Providing line structures with different thicknesses may also be useful. For example, the resistance can be adjusted with varying thicknesses and thermal isolation can be improved with thinner polysilicon line structure due to improved sensitivity. Additional line structure layers may be included in the process to serve as line structures of the stack.

An absorber layer 257 may be provided over the line structure. The absorber layer, for example, is configured to absorb incident infrared radiation. In one embodiment, the absorber layer is disposed on a central portion of the line structure. The absorber layer is thermally coupled to a center of the line structure. The absorber layer may be a titanium nitride (TiN) layer. Other types of absorber layers may also be useful. For example, the absorber layer may be a nickel-chromium (NiCr) layer or a doped silicon layer. In one embodiment, the absorber is configured to absorb most of the incident infrared radiation. For example, the absorber may be configured to absorb greater than 85% of incident infrared radiation having a wavelength of 8-14 µm. Providing any other configurations may also be useful. In other embodiments, the absorber is configured to absorb incident radiation having a wavelength of 2-5 µm. For example, another harmonic of the interferometric absorber is used. In one embodiment, the absorber is configured to absorb >50% of incident radiation having a wavelength of 2-5 µm.

A sensor protection layer 259, in one embodiment, is disposed over the absorber layer. The sensor protection layer serves to protect the sensor from subsequent etch processes. For example, the protection layer serves to protect the line structure and absorber layer from etchants, such as $XeF_2$, used to form the lower sensor cavity. In one embodiment, the protection layer is a silicon oxide layer. Other types of layers which are transparent to infrared radiation and are selective to the etchant used to form the lower sensor cavity may also be useful.

In one embodiment, the lower sensor cavity has a depth which is selected for optimal reflection of infrared radiation by the reflector. In one embodiment, the depth of the cavity is sufficient to ensure ¼ wavelength distance between the absorber and reflector. For example, the optical distance may be about 2-3 µm for detecting infrared radiation having a wavelength of 8-12 µm. Other distances may also be useful, depending on the wavelength to be detected. For example, by decreasing or increasing the optical distance, infrared radiation with smaller or larger wavelengths can be detected respectively. The optical distance is defined as the distance where the infrared radiation wave possesses an optical path going through several layers.

A back-end-of-line (BEOL) dielectric layer 270 is provided on the substrate. For example, the BEOL dielectric layer is provided over the CMOS and sensor regions. The BEOL dielectric layer includes a plurality of interlayer dielectric (ILD) layers 271. An ILD layer includes a via dielectric level 272 disposed below a metal dielectric level 276. The metal level includes metal lines 277 and the via level includes via contacts 273. The metal lines and via contacts may be formed using damascene techniques, such as a single or a dual damascene process. In the case of a single damascene process, the contacts and metal lines are formed in separate processes. In the case of a dual damascene process, the metal lines and contacts are formed in the same process.

In some embodiments, the metal lines may be formed using a reactive-ion etching (RIE) process. For example, a metal layer is formed and patterned by RIE using an etch mask to form the metal lines. The different ILD layers may employ different processes. For example, one ILD layer may employ separate single damascene processes to form the contacts and metal lines, another may employ a dual damascene process to form the contacts and metal lines, and yet another may employ a single damascene process to form the contacts followed by a RIE process to form the metal lines.

The ILD layers may be planarized to form a planar top surface over the CMOS region and the MEMS region. For example, CMP is performed on the substrate. Providing any other planarization techniques such as spin-on-glass (SOG) to fill the gaps or planarize the surface of the substrate may also be useful. The overall thickness of the ILD layers over the structure may be from 100-400 nm. Providing any other thicknesses for the ILD layers over the structure to define the depth of the vias for subsequent standard CMOS process may also be useful.

A passivation layer 278 is disposed above the top metal level. The passivation layer may be a silicon nitride layer. Other types of passivation layers may be used. For example, the passivation layer may be a passivation stack having multiple passivation layers, such as a combination of silicon oxide and silicon nitride layers. The top metal level of the top ILD layer serves as a pad level. Bond openings 279 are provided in the passivation layer to expose the bond pads below. The bond pads provide external access to the internal components of the device. For example, input, output and power signals may be provided via the bond pads. Bond pads are provided in the periphery of the device. As shown, bond pads are provided on one side of the device which is the opposite side of the sensor region. Bond pads may also be provided on one or more of the other sides of the device.

As shown, the BEOL dielectric layer includes 3 ILD layers which include metal layers M1, M2 and M3. The metal layer M1 is the bottom metal layer and the metal layer M3 is the top metal layer. Providing other numbers of ILD layers may also be useful. The number of ILD layers may depend on the CMOS process employed. Typically, the first contact level of the first ILD layer is formed using a single damascene process. For example, contacts are formed to couple to various terminals of the components. The contacts may contact S/D regions of the transistors, well contacts and terminals of the sensor. The first metal level of the first ILD layer may employ a single damascene or a RIE process. As for the second level, it may be formed by a dual damascene process. The top contact level may be formed by a single damascene process and the top metal level may be formed by a RIE process. Other configurations of processes for forming the various ILD layers may also be useful. As shown, the BEOL dielectric material in the sensor region is removed to expose the sensor. For example, the removal of the BEOL dielectric over the sensor forms an upper sensor or BEOL cavity 264.

In one embodiment, the BEOL cavity includes a tapered stepped shape. As shown, the tapered stepped shape tapers from top inwardly to the bottom, resulting in the top part of the BEOL opening being larger than the bottom part of the BEOL opening. The shape of the stepped cavity can be formed using the various metal layers having patterned metal lines which serve as etch masks to define the shape of the BEOL cavity. In addition, one of the metal layers may also be used to serve as an etch mask for the etch process to release line structure from the membrane. The metal layer which serves as a line structure release etch mask may be M1. Other metal layers may also be useful. For example, in the case M1 is used to form the metal contact of the line structure, M2 may be employed to serve as the release etch mask. The portion of the metal layer used as the release etch mask is removed after the etch process.

A cap 290 is disposed on the substrate, encapsulating the CMOS and sensor regions. The cap is disposed on the periphery of the device within the bond pads. For example, the bond pads are disposed outside of the encapsulated CMOS and sensor regions. This enables access to the bond pads. The cap includes an upper cap portion and a lower cap portion. The cap portions may be integrated. For example, the cap portions are formed by a single cap material. As shown, the upper and lower portions of the sides of the cap are aligned. Alternatively, the upper portion may protrude over the bond pad, resulting in non-aligned upper and lower portions on the side with the bond pads. Other configurations of the cap may also be useful.

A cap cavity 265 is provided in the lower portion of the cap and is over the CMOS region and sensor region with the upper cavity 264. The cap cavity and the upper sensor cavity in the may be collectively referred to as the cap cavity. In one embodiment, the cap cavity is a vacuum. The cap is formed of a material which is transparent to infrared radiation. For example, the cap is capable of transmitting infrared radiation to the sensor. The cap may be a silicon (Si) cap. Other types of materials, such as germanium (Ge), silicon-germanium (SiGe) or zinc sulfide (ZnS), may also be used to form the cap. Providing a cap formed from other types of materials which transmit infrared radiation may also be useful.

In one embodiment, the cap includes an anti-reflective region 291. The anti-reflective region facilitates transmission of infrared radiation through the cap. In one embodiment, the anti-reflective region includes a bottom grating 292 on the inner (bottom) surface of the cap and a top grating 294 on the outer (top) surface of the cap. The gratings can have a moth-eye grating pattern or structure to facilitate transmission of infrared radiation. The gratings may have other patterns which facilitate transmission of infrared radiation. The gratings may be formed by etching the surfaces of the cap.

In another embodiment, the anti-reflective region includes anti-reflection coating disposed on the front and back sides of the cap. Materials with different reflective index may be deposited alternatively on the surfaces of the anti-reflective region. For example, materials for the anti-reflection coating may be zinc sulfide or germanium (Ge). Providing any other materials and deposition techniques for the anti-reflective coating may also be useful. The anti-reflective coating may be deposited on the surfaces of the cap and patterned to remain in the anti-reflective region.

In one embodiment, a getter 296 is disposed on the inner surface of the cap. The getter absorbs moisture and outgassing within the encapsulated device. The getter, for example, may be zirconium (Zr) alloys, titanium (Ti), nickel (Ni), aluminum (Al), barium (Ba) or magnesium (Mg). Other types of getter materials such as rare earth element including cerium (Ce) or lanthanum (La) may also be useful. The getter facilitates in maintaining the integrity of the vacuum in the cavity, improving reliability.

In one embodiment, a sealing ring 288 is employed to facilitate bonding of the cap to the substrate. The sealing ring, for example, includes a cap sealing ring 289b and a substrate sealing ring 289a. The cap and substrate sealing rings are mated, bonding the cap to the substrate. In one embodiment, the sealing rings may be a metal or metal alloy. The sealing rings may be gold-based sealing rings, such as gold, gold-tin or a combination thereof. Providing other materials and structures for the sealing rings may also be useful. In one embodiment, the sealing rings are mated by thermal compression. Other techniques for bonding the cap to the substrate by forming thermal compression bonds or eutectic bonds may also be useful.

The cap may be part of a cap wafer which is processed to form a plurality of caps. The cap wafer may be bonded to a wafer with a plurality of devices. For example, wafer level vacuum packaging bonds the caps to the devices. The cap wafer and device wafer are diced to separate the devices into individual vacuum packaged devices.

Figure 3A:
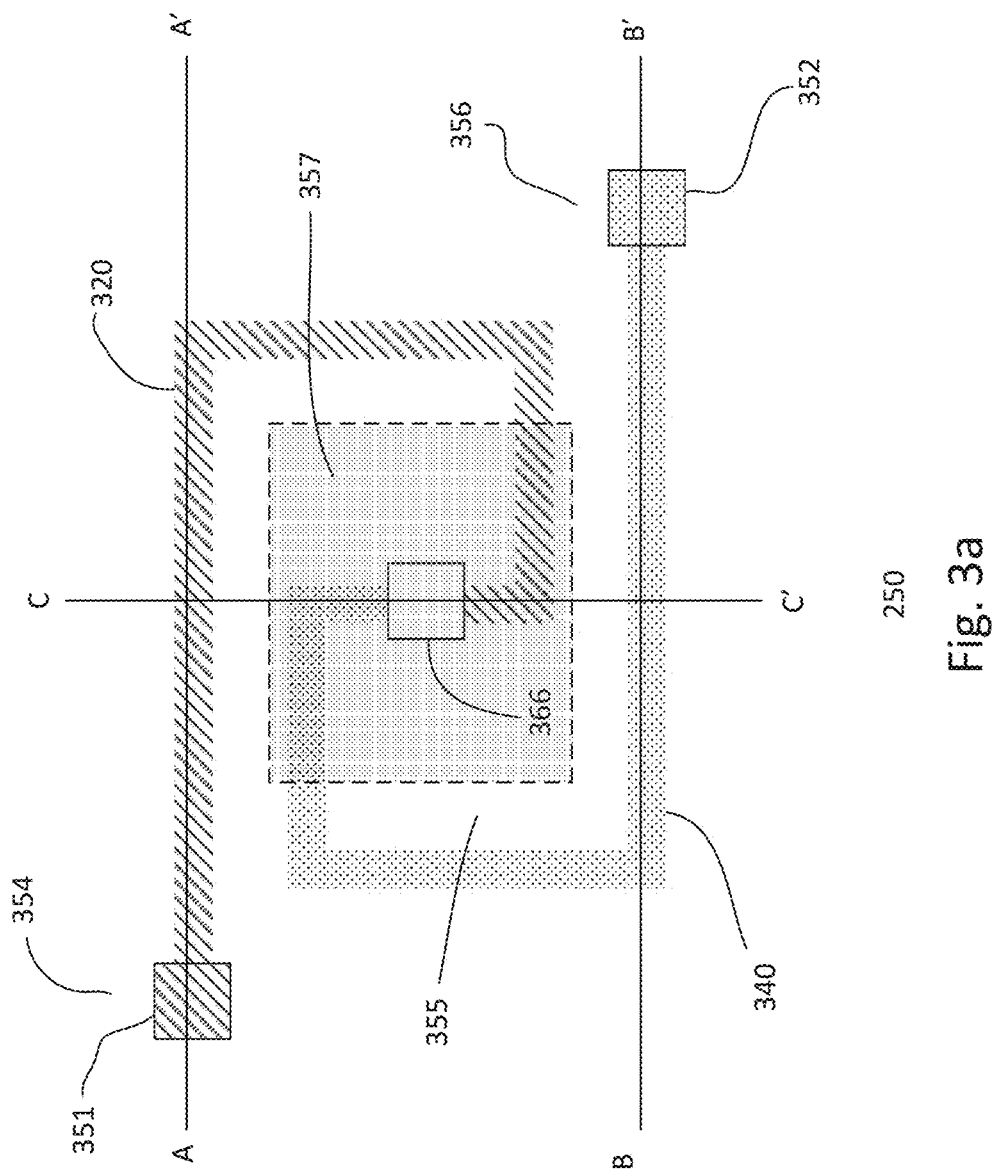
FIGS. 3a-3d show top and cross-sectional views of various embodiments of thermopile structures.
Figure 3B:
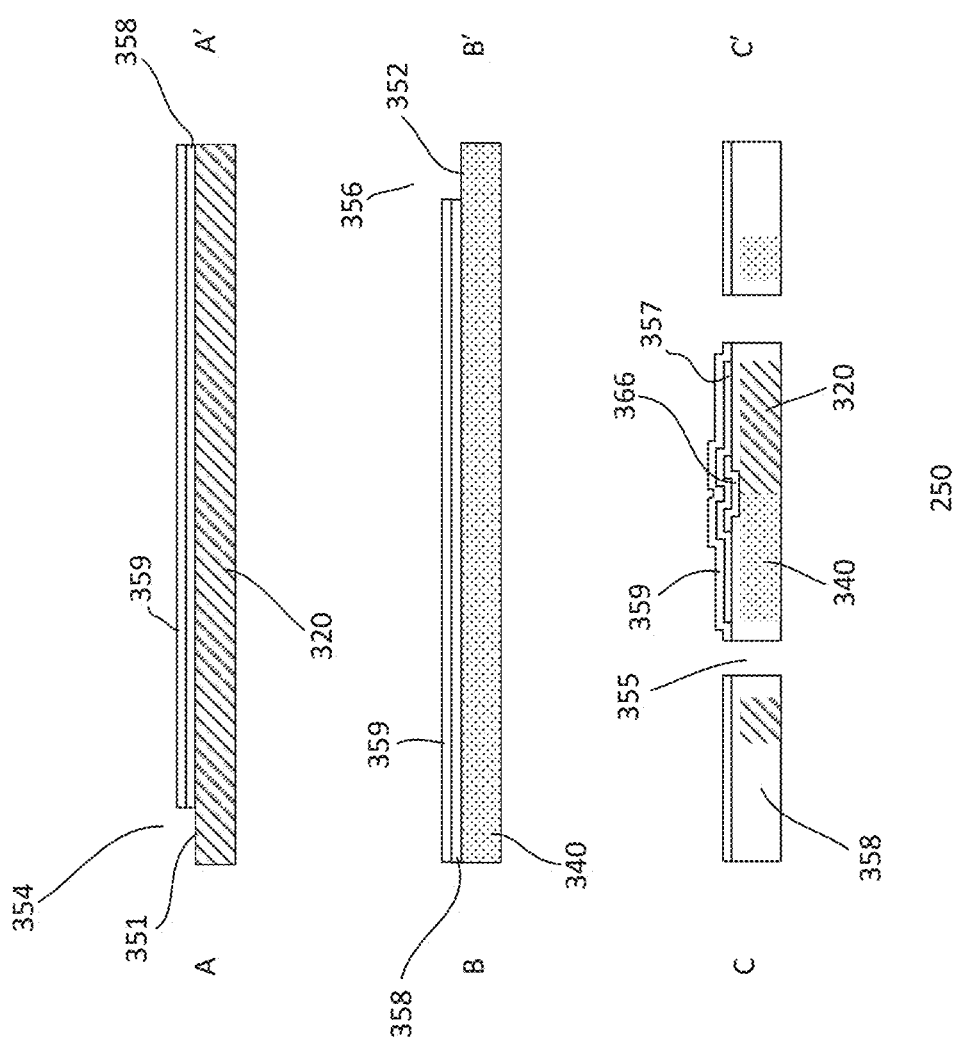

FIG. 3a shows a simplified top view of an embodiment of a MEMS structure 250 and FIG. 3b shows various cross-sectional views of the MEMS structure along A-A', B-B' and C-C'. The top view excludes the protective layer 359. The MEMS structure is a line structure. The line structure is a thermopile which serves as a thermoelectric infrared sensor or detector. The line structure is disposed on the membrane or dielectric layer which defines the top of the lower sensor cavity. The line structure, in one embodiment, includes a single line unit (N=1) which has a meandering shape and occupies the surface of the membrane.

In one embodiment, the line unit includes polysilicon. Other types of line units may also be useful. For example, thermopile materials which are stable at high temperatures may be employed to form the line structure. Such materials may, for example, include SiGe, GaN and 2D materials, such as graphene, black phosphorus or molysulfide.

The line unit includes first and second line segments 320 and 340. A first end 351 is part of the first line segment and a second end 352 is part of the second line segment. A first line structure terminal 354 is disposed at the first end and a second line structure terminal 356 is disposed at the second end. The terminals, for example, are part of the line unit of the line structure. The terminals serve as terminals of the MEMS structure or sensor.

In one embodiment, the first line segment is doped with first polarity type dopant and the second line segment is doped with second polarity type dopants. For example, the first line segment is heavily doped with first polarity type dopants and the second line segment is heavily doped with second polarity type dopants. The first polarity type may be p-type and the second polarity type may be n-type. Providing first polarity type which is n-type and second polarity type which is p-type may also be useful. The doping may be integrated into the implants which form the S/D regions and well contacts. Doping the line segments separately from the implants that form the S/D regions and well contacts may also be useful.

The line structure may be patterned using mask and etch techniques. For example, a photoresist is disposed on a line structure layer. The photoresist may be exposed by an exposure source through a reticle containing the desired pattern of the line structure. After development, the pattern of the reticle is transferred to the photoresist to form an etch mask. An etch is employed to pattern the line structure layer using the etch mask to form the line structure. The etch mask, for example, may be a photoresist mask. The etch, for example, is an anisotropic etch, such as a reactive ion etch (RIE). Other etch processes may also be useful. In one embodiment, the etch forms the line structure with the first and second line segments. Alternatively, the line structure may be a non-continuous line structure having, for example, first and second segments. The first and second segments may be electrically connected by a metal contact. If the line structure is integrated into the gate electrode layer, the mask used to pattern the gates may be used to pattern the line structure. Alternatively, separate mask and etch processes may be used to pattern the gates and the line structure.

As shown, the line segments are mirror images of each other. This produces line segments which are about the same length. By providing a meandering design for the line segments, efficient use of the sensor region can be achieved while producing a line structure having the desired resistance. For example, the line structure has a resistance of about 5-50 k$\Omega$ Other resistances may also be useful.

To dope the first and second line segments, separate implants may be used. For example, a first implant using a first implant mask is used to dope the first line segment and a second implant using a second implant mask is used to dope the second line segment. In the case where doping of the line segments is integrated into the S/D implants, the implant masks may be those used for p-type and n-type S/D implants.

A line dielectric layer 358 covers the line structure, filling the gaps. The line dielectric layer provides mechanical support for the thermopile membrane. The line dielectric layer may be a self-planarizing dielectric layer, such as spin-on-glass (SOG). Other types of self-planarizing dielectric materials may also be useful. The dielectric layer may have a top surface which is about 100-400 nm above the top of the line structure. Providing a dielectric layer having other thicknesses over the top of the line structure may also be useful.

A contact 366 is provided to electrically couple the first and second segments. The contact, for example, is a metal contact, such as titanium (Ti) or aluminum (Al). Other types of contacts may also be useful. To form the contact, a contact opening is formed in the dielectric layer to expose the line structure at about the junction of the first and second segments. A metal layer is formed on the substrate and patterned, leaving the contact coupling the first and second segments. The metal layer, for example, may be titanium (Ti) or aluminum (Al) formed by sputtering or plating. Other types of metal layers or forming techniques may also be useful. In other embodiments, the contact may be formed by a damascene technique. For example, a via opening is formed in the dielectric layer. A conductive layer is formed, filling the via opening and covering the dielectric layer. A planarizing process, such as CMP, is performed to form the metal contact in the via opening, connecting the first and second segments of the line structure.

An absorber layer 357 is formed on the substrate, covering the dielectric layer. The absorber layer may be patterned using etch and mask processes. The patterned absorber layer serves as an absorber above the line structure. In one embodiment, the absorber layer is patterned, covering a central portion of the line structure and contact, leaving the leg portions outside the central portion exposed. The absorber layer, for example, absorbs infrared radiation. The absorber layer may be a TiN or NiCr layer. The absorber layer, for example, may be formed by sputtering. Other types of absorber layers may also be useful. In one embodiment, the absorber is configured to absorb most of the infrared radiation. For example, the absorber may be configured to absorb greater than 85% of infrared radiation having a wavelength of 8-14 μm. Absorbing other wavelengths may also be useful. As shown, the absorber layer is disposed over the contact. The absorber serves as a hot junction of the thermopile. The leg portions of the line structure uncovered by the absorber serve as the cold junction if the thermopile.

A protective layer 359 may be provided. The protective layer, for example, covers the MEMS structure. The protective layer protects the MEMS structure from subsequent processes. The protective layer, for example, is a silicon oxide layer formed by CVD. Other types of protective layers may also be useful. The protective layer may be a dielectric layer between a metal layer and the metal contact. For example, the protective layer may be a dielectric layer between M1 (contact) and M2. Other configurations of metal layers and the protective layer may also be useful.

In one embodiment, the protective layer forms an upper portion of the first via level of the first ILD layer of the BEOL dielectric layer. The protective layer, line dielectric layer and membrane forming the top of the cavity are patterned to form openings 355, separating the legs from the central portion of the line structure. The openings provide access to the cavity. This enables removal of the sacrificial fill in the cavity, releasing the line structure. In one embodiment, one of the metal layers in the BEOL dielectric may be patterned to serve as a line structure release etch mask for patterning the various layers to form openings 355 to release the line structure. For example, the metal layer may be M1 or M2. Other metal layers may also be used to serve as an etch mask for the release etch process.

Figure 3C:
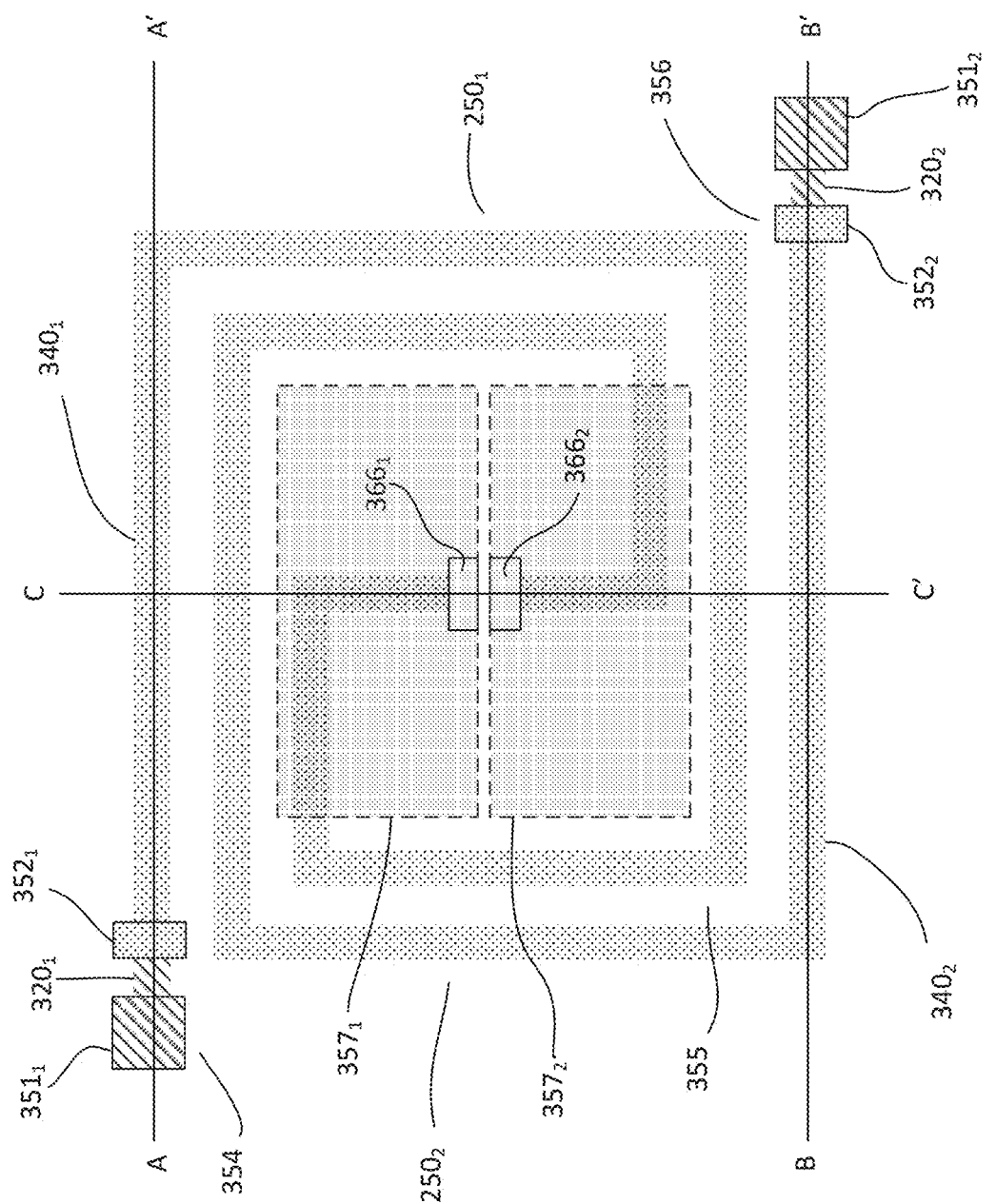
Figure 3D:
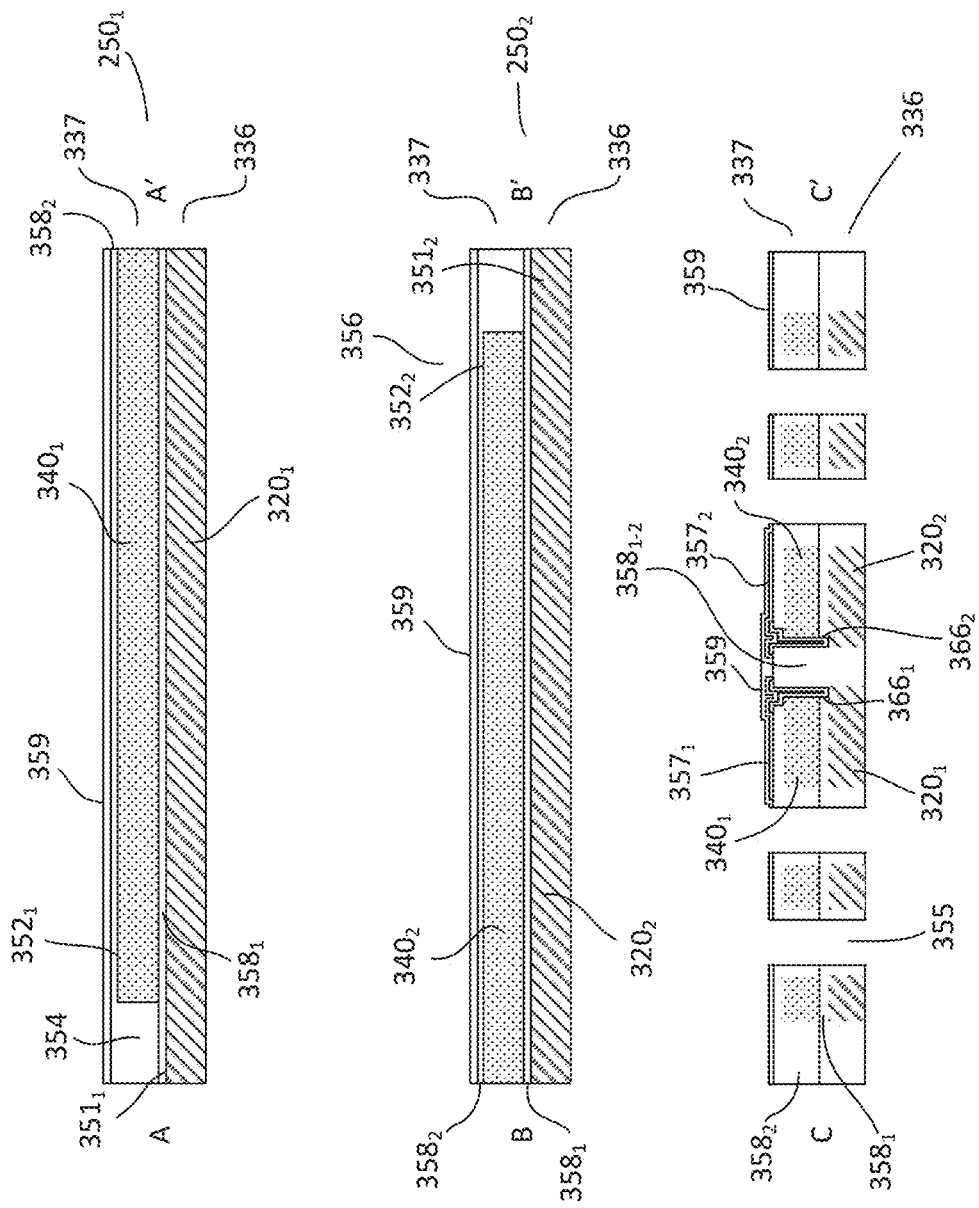

FIG. 3c shows a top view of another embodiment a MEMS structure 250 and FIG. 3d shows cross-sectional views of the MEMS structure based on the top view of the MEMS structure of FIG. 3c. The cross-sectional views are along A-A', B-B' and C-C'. The MEMS structure is a line structure forming a thermopile which serves as a thermoelectric infrared sensor. The top view excludes the protective layer protecting the line structure. The line structure is similar to that described in FIGS. 3a-3b. Common elements may not be described or described in detail. The line structure is disposed on the membrane which structures the cavity.

The line structure has more meanderings or turns to increase the length of the segments which occupy the surface of the membrane as compared to FIGS. 3a-3b. This increases the resistance of the line structure. Other designs for the line segments to increase the length or to tailor the lengths of the segments to achieve the desired resistance may also be useful.

In one embodiment, the MEMS structure is a multi-line unit line structure with N number of line units that are coupled in series to form a thermoelectric infrared sensor. As shown, the MEMS structure includes first and second line units $250_1$ and $250_2$ (e.g., N=2). Providing other numbers of line unit for the multi-line unit line structure may also be useful. For example, a multi-line unit line structure may have 2-4 (N=2-4) line units. Preferably, a multi-line unit line structure has $N^2$ line units. Preferably, N is equal to 1-2. Other numbers of line unit may also be useful.

As discussed, the line structure shown includes first and second line units ($N^2$ where N=1). In one embodiment, a line unit of the multi-line unit line structure is a stacked line unit. The first and second stacked line units may be disposed adjacent to each other on the dielectric layer within the sensor region. As shown, a center of the sensor region serves as contact regions for the first and second contacts $366_1$ and $366_2$ of the first and second line units $250_1$ and $250_2$. The line units at the contact region are separated by dielectric layers $358_{1-2}$.

A stacked line unit includes a first segment ($320_1$ or $320_2$) disposed in a first line level 336 and a second line segment ($340_1$ or $340_2$) disposed in a second line level 337. The first and second line levels may be separated by a first dielectric layer $358_1$. For example, the second line segment of a line unit in the second line level is overlaid over the first line segment of the line unit in the first line level. The first and second line segments of a line unit are separated by the first interline level dielectric layer $358_1$. The gaps of the line segments are filled by the first and second interline level dielectric layers $358_{1-2}$.

A contact ($366_1$ or $366_2$) connects the first line segment in the first line level to the second line segment in the second line segment. The first and second contacts are formed in the first and second interline level dielectric layers. For example, the contacts are disposed in contact vias. A contact via for a line unit, for example, may overlap the first and second line segments, exposing them. A contact, such as Ti or Al, lines the contact via, connecting the exposed first and second line segments.

In one embodiment, the first line segments of the line units are doped with first polarity type dopants and the second line segments of the line units are doped with second polarity type dopants. For example, the first segments of the line units in the first are doped with first polarity type dopants and the second segments of the line units in the second level are doped with second polarity type dopants. The first polarity type may be n-type and the second polarity type may be p-type. Other configurations of doped line segments may also be useful.

As shown, the first line unit has first and second ends $351_1$ and $352_1$ which are located at a diagonally opposite corner of the sensor region than the first and second ends $351_2$ and $352_2$ of the second line unit. The line units each meander throughout the sensor region from opposite diagonal corners towards the contact region. Other configurations of or meandering patterns for the line units may also be useful. For example, the first stacked line unit may occupy about one-half the sensor region and the second stacked line unit may occupy about the other half of the sensor region.

First and second absorber layers $357_1$ and $357_2$ are disposed on the substrate over the second line dielectric layer $358_2$. As shown, the layers cover a central portion of the sensor region, including the contact regions of the first and second contacts. For example, the first absorber covers the central portion of the sensor region and first contact region of the first line unit and the second absorber covers the central portion of the sensor region and the second contact region. The first and second absorber layers, since they are conductive, are distinct absorber layers.

The absorber layers, for example, absorb infrared radiation. The absorber layers may be TiN or NiCr layers. Other types of absorber layers may also be useful. In one embodiment, the absorber is configured to absorb most of the infrared radiation. For example, the absorber may be configured to absorb greater than 85% of infrared radiation having a wavelength of 8-14 μm. Absorbing other wavelengths may also be useful. As shown, the absorber layer is disposed over the contact. The absorber serves as a hot junction of the thermopile. The leg portions of the line structure uncovered by the absorber serve as the cold junction if the thermopile.

The process for forming the stacked line structure may include, for example, forming a first line segment layer on the substrate, including in the sensor region over the sensor membrane dielectric layer over the cavity. In one embodiment, a polysilicon layer is formed on the substrate by CVD. The first line segment layer is patterned to form distinct first line segments $320_1$ and $320_2$ of the first and second line units. Patterning may be achieved using mask and etch techniques, such as a resist mask and RIE. The first segments may be doped with first polarity type dopants, such as n-type dopants. Doping the segments may be achieved by selectively implanting first polarity type dopants using an implant mask. A first interlevel line dielectric layer $358_1$ may be formed on the substrate. The first interlevel dielectric layer lines the line segments and surface of the sensor membrane layer. The first interlevel dielectric layer, for example, lines the line segments without filling the gaps therebetween. The first interlevel dielectric layer may be a silicon oxide layer formed by CVD. Providing a SOG dielectric layer may also be useful.

A second line segment layer, such as polysilicon is formed on the first interlevel line dielectric layer by CVD and patterned to form distinct second line segments $340_1$ and $340_2$ of the first and second line units using mask and etch techniques. The second line segments, for example, overlaid the first line segments and separated by the first interlevel line dielectric layer. The second line segments are doped with second polarity type dopants, such as p-type dopants. The second line segments may be doped by implanting second polarity type dopants using an implant mask.

A second interlevel line dielectric liner $358_2$ is formed on the substrate. In one embodiment, the second interlevel line dielectric layer may be a SOG layer, filling the gaps and forming a planar top surface over the second line segments. First and second contact vias are formed in the interlevel line dielectric layers in the contact region. The first contact via exposes first and second segments of the first line unit and the second contact via exposes the first and second segments of the second line unit. The contact vias may be formed by mask and etch techniques. A contact layer, such as Ti or Al is deposited on the substrate. Other types of metal contact layers may also be useful. The contact layer, for example, may be deposited by sputtering and lines the second interlevel line dielectric layer and contact vias. In one embodiment, the contact layer lines the contact vias without filling them. The contact layer is patterned by mask and etch techniques to form first and second contacts $366_1$ and $366_2$ of the first and second line units. In other embodiment, a metal contact may be formed, filling the via openings. A polishing process, such as CMP, may be performed to remove excess metal material, leaving contacts in the contact vias.

An absorber layer is formed on the substrate, covering the second interlevel line dielectric layer and contacts. The absorber layer, for example, is a conductive layer formed by sputtering. The absorber layer is patterned to form distinct first and second absorber layers $357_1$ and $357_2$ in the central portion of the sensor region using mask and etch techniques. In the case the contacts line the vias without filling them, the absorber layer may serve to fill the contact vias over the contacts.

A protective layer 359 may be provided. The protective layer, for example, covers the MEMS structure. The protective layer protects the MEMS structure from subsequent processes. The protective layer, for example, is a silicon oxide layer formed by CVD. Other types of protective layers may also be useful.

The protective layer, line dielectric layer and membrane forming the top of the cavity are patterned to form openings 355, separating the legs from the central portion of the line structure. For example, a patterning process is performed to release the line units of the line structure. The openings provide access to the cavity. This enables removal of the sacrificial fill in the cavity, releasing the line structure. The mask of the patterning process, in one embodiment, may be served by a metal layer of the BEOL dielectric. For example, the mask may be served by M1 or M2 of the BEOL dielectric. In other embodiments, the mask may be a patterned resist mask.

As discussed, the first and second line units $250_1$ and $250_2$ are coupled in series. In one embodiment, the second end $352_1$ of the first line unit is coupled to the first end $351_2$ of the second line unit. The series connection in the line unit may be facilitated by via contacts in the interlevel line dielectric layers which are coupled to the second end of the first line unit and the first end of the second line unit. A metal line may be provided in the BEOL dielectric layer, such as in M1, to connect the via contacts. Other configurations of providing the series connection of the line units may also be useful.

As described, the line segments of the line units are disposed in the same line level and are doped with the same dopant type. This allows the line segments of the line units to be doped using a single implant process (e.g., same implant process using a single implant mask). In alternative embodiments, the line segments of the line units in the same line level may be doped with opposite polarity type dopants. In such cases, the line segments are doped by separate implant processes (e.g., different implant processes using different implant masks). As such, providing line segments of the line units which have the same doping type in the same line level reduces the need to use additional implant masks. Other configurations of line segments for the line units may also be useful.

As described, the MEMS structure includes 2 line structures which are stacked and coupled in series. Stacking other numbers of line structures which are coupled in series may also be useful. Preferably, the line structures of the stack have similar designs. However, it is understood that this is not necessary. In addition, the line structures may have layouts other than that described in FIGS. 3a-3d.

Figure 3E:
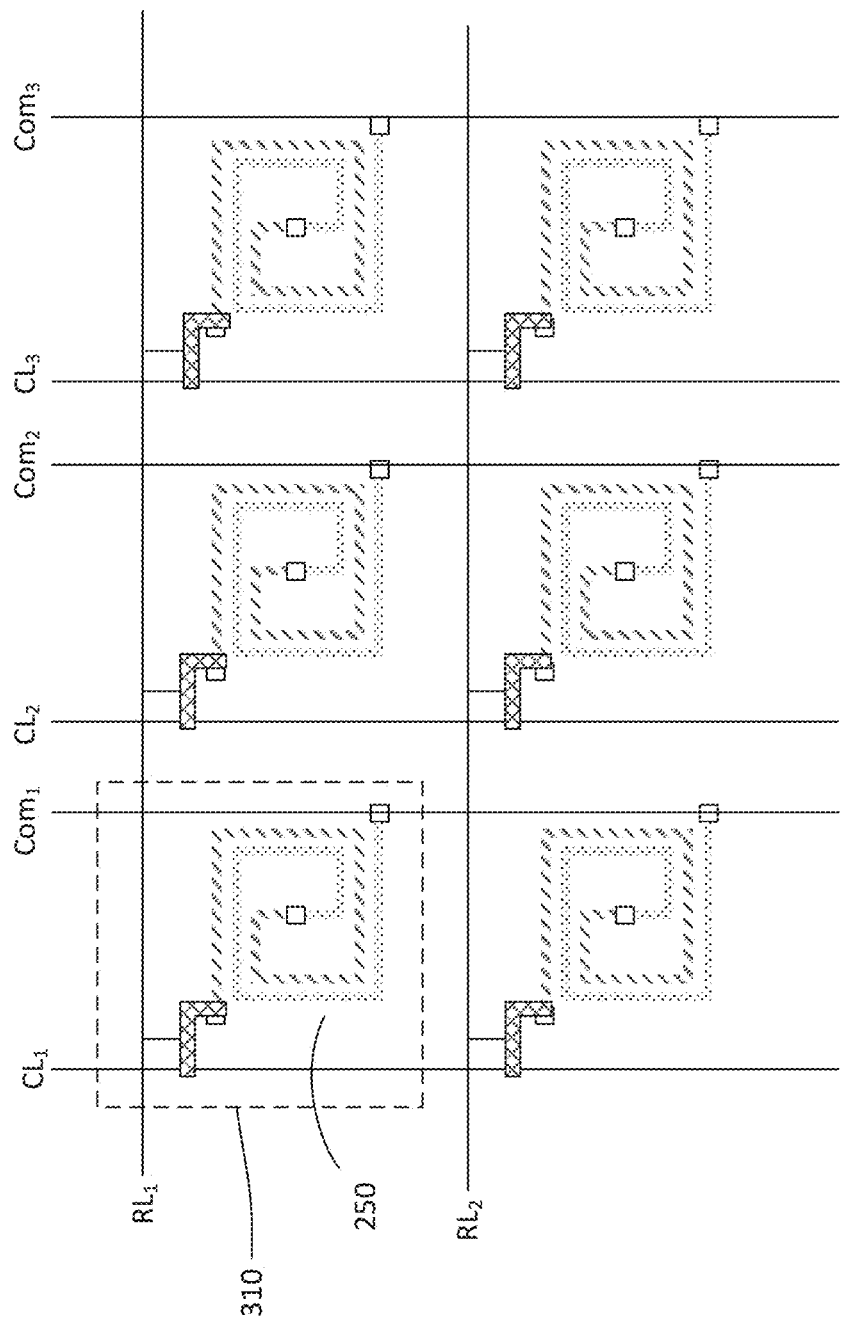
FIG. 3e shows a sensor array.

FIG. 3e shows a sensor array 304. The sensor array includes a plurality of sensor cells 310. A sensor cell includes a switch coupled to a MEMS structure, such as a line structure or structures as described in FIGS. 3a-3d. Common elements may not be described or described in detail.

The sensor cells are configured to form an array having Y rows and Z columns. A sensor cell corresponds to a pixel of the sensor array. The sensor cells are coupled in a row direction by row lines ($RL_m$) and in the column direction by column lines ($CL_n$). A sensor cell may correspond to a pixel. Additionally, common lines (Coms) are also used to couple the sensor cells in each column. For example, each column of sensors is coupled to a respective Com (e.g., $Com_1$, $Com_2$ or $Com_3$). As shown, the array includes a 2×3 array (Y=2 and Z=3). For example, the sensor cells are arranged in 2 rows ($RL_1$ and $RL_2$) and 3 columns ($CL_1$, $CL_2$ and $CL_3$). Other sized arrays may also be useful. For example, the sensor array may be a 32×32 or 80×62 array.

The pixels of the sensor array may include a plurality of sensors arranged in a matrix on the substrate. For example, each pixel may include a sensor region and a CMOS switching or connection region. The sensor regions are disposed in, for example, a sensor array region of the substrate. For example, the sensor array region includes a plurality of sensor regions corresponding to sensor pixels.

In one embodiment, a first terminal of the MEMS structure of a sensor cell is coupled to the switch while a second terminal is coupled to a common line (Com). As shown, each column of sensor cells is coupled to a respective Com (e.g., $Com_1$, $Com_2$, and $Com_3$). A switch may be a transistor having first and second S/D terminals and a gate or control terminal. For example, a first S/D terminal of the switch is coupled to the first terminal of the MEMS structure and the second S/D terminal is coupled to a CL. The RL is coupled to a gate or control terminal of the switch. In one embodiment, the n-type terminal of the sensor cell is coupled to Com and the p-type terminal of the sensor cell is coupled to CL. Other configurations of coupling the sensor cell to CL and Com may also be useful. A RL can be selected to select a row of sensor cells. A CL is activated to select a column of sensor cells. The selected cell is the intersection of the selected RL and selected CL. The interconnections between the CMOS components and sensor pixels may be achieved through the ILD layers of the BEOL dielectric.

In one embodiment, the sensor array is configured to read out a row of sensor cells or pixels. For example, the pixels of the array are read out one row at a time. In one embodiment, a RL of the array is selected. This selects a row of pixels. CLs are then selecting, causing the pixels of the selected RL to be read out. In one embodiment, the array is configured to read out one row of pixels at a time, starting from the first row to the last. The information read out are stored in memory. An image or one frame of the imager will be produced once all pixels are read out or once all rows have been scanned through. For example, information stored in memory read out from the pixels may be reconstructed to form an image.

In the case of the 2×3 array FIG. 3e, scanning the pixels to form an image may include selecting $RL_1$ (the first row) to select the pixels coupled to $RL_1$. After $RL_1$ is selected, $CL_1$, $CL_2$ and $CL_3$ are selected, causing the pixels coupled to $RL_1$ to be read out. The information of the pixels coupled to $RL_1$ is stored in memory. The next or second row $RL_2$ is selected to select the pixels of $RL_2$. After $RL_2$ is selected, $CL_1$, $CL_2$ and $CL_3$ are selected, causing the pixels coupled to $RL_2$ to be read out. The information of the pixels coupled to $RL_2$ is stored in memory. Since $RL_2$ is the final row of the array, the information of the pixels is reconstructed to form an image or a frame of the imager. Numerous frames may be collected by repeating the sensing, read out and reconstruction process. For example, an image or a frame is time dependent.

Select logic and output logic components may be employed to select the cell for outputting information contained. The logic components may be CMOS transistors or components in the CMOS region of the device. Other logic components, including memory and reconstruction logic components, may be included to store and reconstruct information to form an image or images. In one embodiment, the memory and reconstruction logic components may be off-chip logic. Providing these logic components as on-chip logic components or a combination of on-chip or off-chip components may also be useful.

FIGS. 4a-4l show cross-sectional views of an embodiment of a process for forming a device 400. The device, for example, is similar to that described in FIG. 2 and FIGS. 3a-3e. Common elements may not be described or described in detail.

Referring to FIG. 4a, a substrate 401 is provided. The substrate, for example, may be a semiconductor substrate, such as a silicon substrate. Other types of substrates or wafers may also be useful. For example, the substrate may be a silicon germanium, germanium, a gallium arsenide, or a crystal-on-insulator (COI) such as silicon-on-insulator (SOI) substrate. The substrate may be a doped substrate. For example, the substrate can be lightly doped with p-type dopants. Providing a substrate with other types of dopants or dopant concentrations, as well as an undoped substrate, may also be useful.

The substrate, as shown, is prepared with first and second device regions 404 and 406. The first region is a CMOS region while the second region is a sensor. The CMOS region is configured to include CMOS components and the region is configured to include a MEMS component, such as a sensor. In one embodiment, a lower sensor cavity 460 is formed in the sensor region of the substrate. The lower sensor cavity may be formed by etching the substrate using a mask. The mask, in one embodiment, may be a patterned photoresist mask with an opening corresponding to the lower sensor cavity. Alternatively, the mask may be a hard mask, such as silicon oxide or silicon nitride or metal lines in the ILD layers which are patterned with a photoresist mask to include an opening corresponding to the lower sensor cavity. An anisotropic etch, such as a reactive ion etch (RIE), etches the substrate to form the lower sensor cavity.

As shown in FIG. 4b, a reflector 441 is formed at the bottom of the lower sensor cavity. In one embodiment, the reflector is a metal silicide layer formed at the bottom of the lower sensor cavity. The metal silicide reflector may be a titanium silicide ($TiSi_x$), a tungsten silicide ($WSi_x$) or an aluminum silicide ($AlSi_x$) reflector. Other types of metal silicide reflectors may also be useful.

To form the reflector, a conductive metal layer is formed on the substrate. The conductive metal layer may line the surface of the substrate and bottom of the lower sensor cavity. In one embodiment, the mask used to form the substrate remains. As such, the conductive metal layer covers the mask on the surface of the substrate. In the case of a photoresist mask, it is removed after depositing the conductive metal layer. This removes the conductive metal layer over the mask, leaving a portion of the conductive metal layer which covers the bottom of the lower sensor cavity. An anneal is performed, causing a reaction between the conductive metal and silicon substrate of the cavity bottom to form the metal silicide layer. In the case of a hard mask, the metal layer over the substrate is not removed. The hard mask prevents the reaction with the substrate. Unreacted metal and the hard mask are removed after the anneal. Removing the unreacted metal and hard mask may be achieved using a first wet etch.

Alternative types of reflectors may also be formed at the bottom of the lower sensor cavity. In another embodiment, the reflector is a doped region at the bottom of the cavity. For example, an implant may be performed using the mask that forms the lower sensor cavity. The implant implants reflector dopants to form the reflector at the bottom of the lower sensor cavity. The reflector dopants may be n-type or p-type. The dopant concentration of the reflector is selected accordingly to reflect infrared radiation at a desired degree of reflection. For example, the dopant concentration of the doped reflector layer may be about $10^{21}$ dopants/cm$^3$. The conductive properties of the surface of the doped region are attributed to the high concentration of dopants being applied, thereby enabling the reflection of the incoming infrared radiation. After implanting the dopants, the implant mask is removed.

In other embodiments, the reflector may be a non-conductive reflector, such as a photonic crystal reflector. For example, a photonic crystal layer is formed by etching the surface of the lower sensor cavity. The photonic crystal layer may include a grating pattern configured to reflect incident infrared radiation. For example, different grating patterns of varying depths may be etched from the surface of the photonic crystal layer to adjust the wavelengths and properties of the reflected infrared radiation. The photonic crystal layer may include a grating pattern configured to reflect incident radiation. Forming other types of reflectors may also be useful.

Referring to FIG. 4c, after forming the reflector, a reflector protective liner 444 is formed on the substrate. For example, the protective liner serves to protect the reflector from etchants, such as $XeF_2$, used in a release process to form the lower sensor cavity but is being structured and etched away at the CMOS region. The protective liner may be a silicon oxide liner. Other types of protective liners may also be used. The protective liner may be formed by, for example, chemical vapor deposition (CVD). The protective liner lines the substrate as well as the sides and bottom of the lower sensor cavity, covering the reflector.

A sacrificial layer 460 is formed on the substrate. The sacrificial layer covers the substrate and fills the lower sensor cavity. In one embodiment, the sacrificial layer is a polysilicon layer. Other types of sacrificial materials may also be used for the sacrificial layer. The sacrificial layer may be formed by CVD. Excess sacrificial material over the substrate is removed. For example, a polish, such as a chemical mechanical polish (CMP) is employed to remove the excess sacrificial material. In one embodiment, the CMP removes excess sacrificial material as well as the protective liner covering the substrate surface. The CMP forms a planar top surface on the substrate and sacrificial layer in the cavity. Providing any other polishing techniques may also be useful. For example, fabrications that do not possess CMP will require to perform structuring and isotropic back etching processes to planarize the surface which may rely on RIE or deep RIE back etching.

A dielectric layer 443 is formed on the substrate. The dielectric may be a silicon oxide layer. Other types of dielectric layers may also be formed. The dielectric layer is patterned, leaving it remaining over the lower sensor cavity with the sacrificial fill. The dielectric layer protects the sensor region while the CMOS region is processed. The dielectric layer defines a top of the lower sensor cavity and serves as a membrane for a sensor in the sensor region. The dielectric layer may be formed by CVD and patterned using mask and etch processes.

Figure 4D:
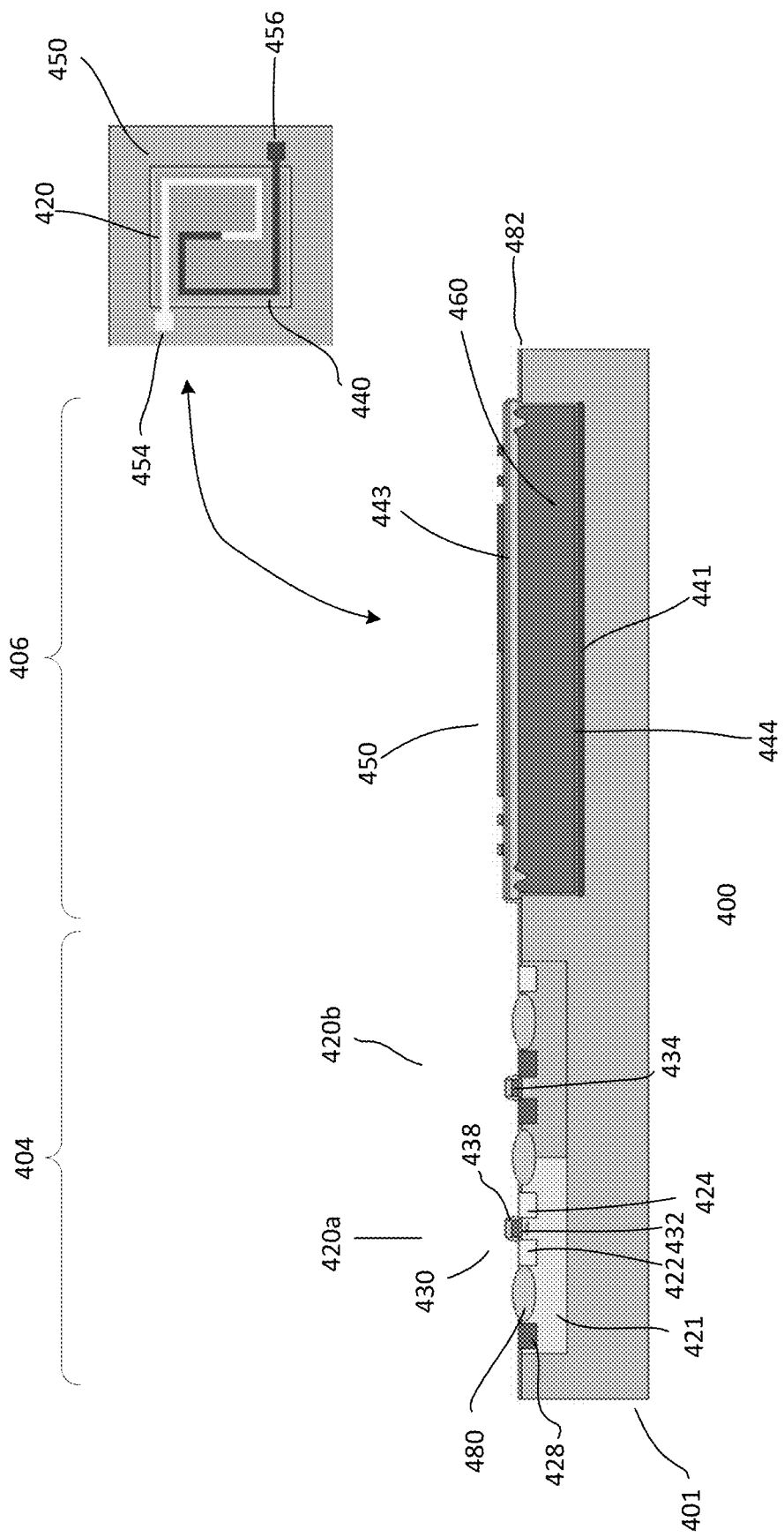

Referring to FIG. 4d, the CMOS region is processed. For example, front-end-of-line (FEOL) processing is performed on the substrate. The CMOS region of the substrate is processed to include first and second transistor regions 420a and 420b. In one embodiment, first and second transistor wells 421 are formed in the first and second transistor regions. The first transistor well may be a p-type well for an n-type MOS transistor and the second transistor well may be an n-type well for a p-type MOS transistor. The wells, for example, may be formed by ion implantation using an implant mask. The implant mask may be a photoresist implant mask patterned to provide openings for the implant regions. Separate implant processes are employed for forming p-type and n-type wells.

As shown, isolation regions 480 are formed on the substrate to isolate the different regions of the substrate. The isolation regions, for example, may also be provided for well contact regions. The isolation regions, for example, are field oxide (FOX) isolation regions. The FOX regions may be formed by selective thermal oxidation of the substrate using a nitride mask. Other types of isolation regions may also be useful. For example, the isolation regions may be shallow trench isolation (STI) regions. The STI regions are trenches formed in the substrate and are filled with dielectric material, such as silicon oxide. The STI regions may have a coplanar top surface with the substrate produced by CMP. In one embodiment, the STI regions are formed prior to dopants implantation so as not to be influenced their growth by the doping of the silicon.

Gate layers are formed on the substrate. In one embodiment, the gate layer includes a gate dielectric layer and a gate electrode layer. The gate dielectric layer may be a thermal oxide layer while the gate electrode layer may be a polysilicon layer. The gate electrode layer may be formed by CVD. The gate electrode layer, for example, covers the substrate in the CMOS and sensor regions. The gate electrode layer is patterned to form gates 430 in the transistor regions. Patterning the gate electrode layer may be achieved using mask and etch techniques. For example, the gate electrode layer is patterned by RIE using a patterned resist mask. A gate includes a gate electrode 434 over a gate dielectric 432.

In one embodiment, the gate electrode layer is patterned to form gates in the transistor regions and a MEMS structure 450 in the sensor region. The MEMS structure may be a sensor. The MEMS structure may be a thermopile structure which serves as a thermoelectric sensor. Other types of MEMS structures may also be useful. In one embodiment, the MEMS structure includes a line structure 450, as shown in the top view of the sensor region. The line structure may be similar to that described in FIGS. 3a-3b. For example, the line structure includes first and second line segments 420 and 440 with a first terminal 454 and a second terminal 456. Other shaped line structures may also be useful. The cross-sectional view of the MEMS structure is a simplified view and may not be reflective of the top view.

In alternative embodiments, the MEMS structure is formed with a separate process. For example, the MEMS structure may be formed after forming the gates. In such case, a MEMS structure layer is formed on the substrate and patterned to form the line structure. The MEMS structure layer may be polysilicon. Other types of MEMS structure layers may also be useful. For example, the MEMS structure layer may be silicon germanium (SiGe), gallium nitride (GaN) or a 2D material, such as graphene, black phosphorus or molysulfide.

In the case that separate processes are used to form the MEMS structure, the CMOS region may be protected by a hard mask layer. The hard mask layer, for example, may be a dielectric layer, such as a silicon oxide or silicon nitride layer. The hard mask layer may be patterned to expose the sensor region, leaving the CMOS region protected. The hard mask layer may serve as an etch stop layer. Other types of hard mask layers may also be useful. The hard mask layer enables the MEMS structure layer to be patterned in the sensor region, while protecting the CMOS region. After forming the MEMS structure, the etch stop layer may be removed.

Source/drain (S/D) regions 422 and 424 are formed adjacent to the gates. The S/D regions are heavily doped regions. For example, the first transistor includes heavily doped n-type S/D regions while the second transistor includes p-type S/D regions. Lightly doped extension regions may be provided for the S/D regions. Dielectric sidewall spacers 438 may be formed on sidewalls of the gates to facilitate the formation of the lightly doped extension regions.

In one embodiment, lightly doped extension regions are formed adjacent to gates. P-type lightly doped extension regions are formed adjacent to the gate of the p-type transistor and n-type lightly doped extension regions are formed adjacent to the gate of the n-type transistor. Separate implants may be employed to form different types of lightly doped extension regions using implant masks, such as photoresist masks.

After forming the extension regions, a spacer dielectric layer is formed on the substrate. The spacer dielectric layer may be a silicon oxide layer. Other types of spacer dielectric layers may also be useful. An anisotropic etch is performed, removing horizontal portions of the spacer dielectric layer, leaving spacers on sidewalls of the gate. P-type S/D regions are formed adjacent to the gate of the p-type transistor and n-type S/D regions are formed adjacent to the gate of the n-type transistor. Separate implants may be employed to form different types of S/D regions using implant masks, such as photoresist masks.

In one embodiment, the implants to form the S/D regions are also employed to form the doped segments of the line structure. For example, the p-type implant to form p-type S/D regions also forms the p-type segment of the line structure and the n-type implant to form n-type S/D regions also forms the n-type segment of the line structure. Forming the doped segments of the line structure using separate implants from those used to form S/D regions may also be useful.

In other embodiments, stacked line units may be formed in the sensor region, as previously discussed with respect to FIGS. 3c-d. Forming the stacked line units may be separate from the processes to form CMOS components (CMOS processes). Partially or fully incorporating the CMOS processes for forming the stacked line units may also be useful. This, for example, may depend on the CMOS process employed. Other configuration of forming the CMOS components and MEMS structure may also be useful.

Metal silicide contacts may be formed on the substrate. For example, metal silicide contacts may be formed on the S/D regions, gates and well contacts. A metal layer, such as Ti, W or Al, may be deposited on the substrate and annealed to cause a reaction between the metal and silicon to form metal silicide contacts. Unreacted metal is removed by, for example, a wet etch, leaving the metal silicide contacts.

Figure 4E:
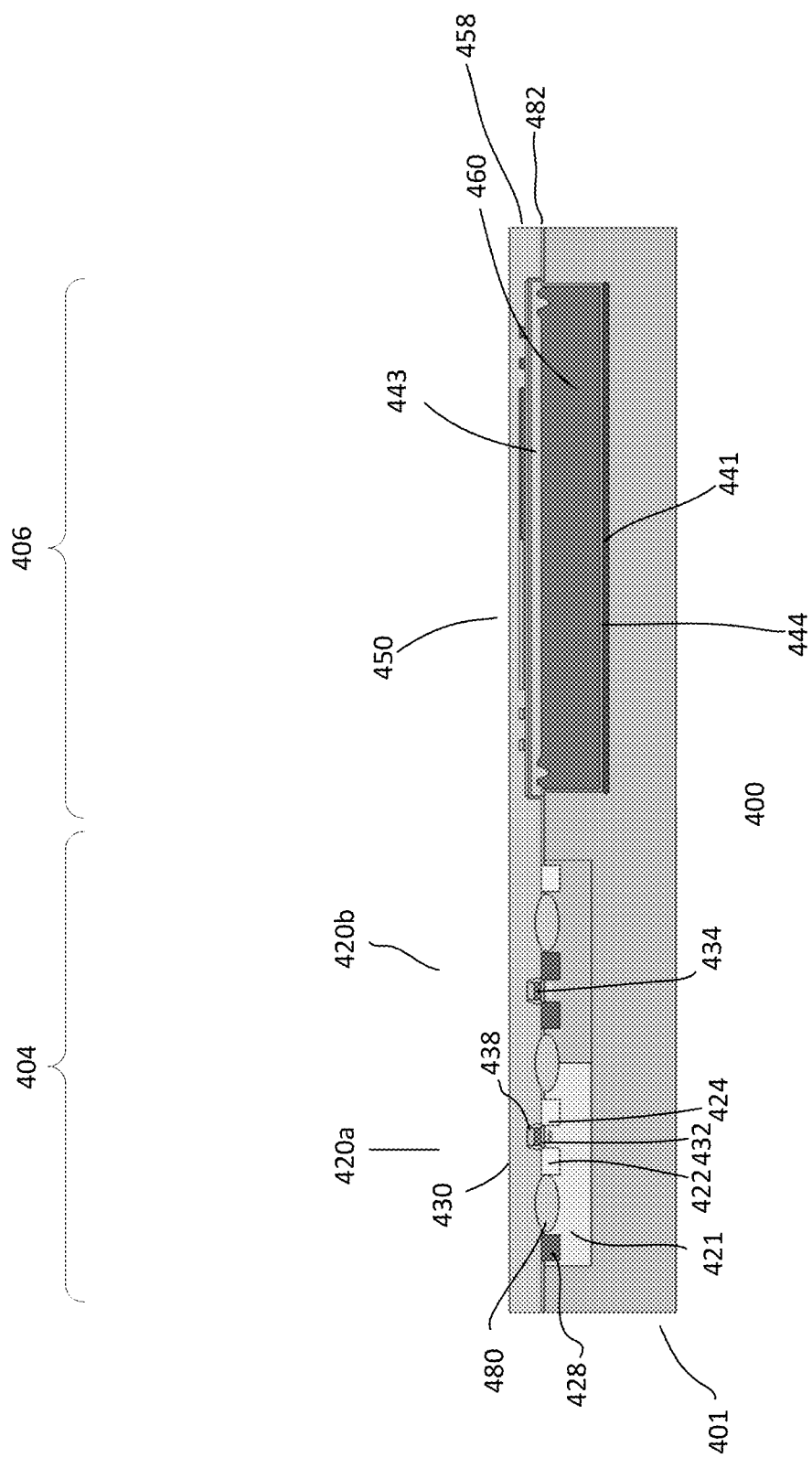

In FIG. 4e, a first dielectric layer 458 is formed over the substrate. In one embodiment, the dielectric layer covers the CMOS and sensor regions. For example, the dielectric layer covers the transistors and MEMS structure. The dielectric layer serves as part of the first via or contact level of the first ILD layer. The dielectric layer may be silicon oxide formed by CVD. Other types of dielectric layers may also be useful. A polishing process, such as CMP, is performed to produce a planar top surface of the dielectric layer. The planar top surface is above the sensor and transistors. Providing any other planarization techniques such as spin-on-glass (SOG) to fill the gaps or planarize the surface of the substrate may also be useful.

Figure 4F:
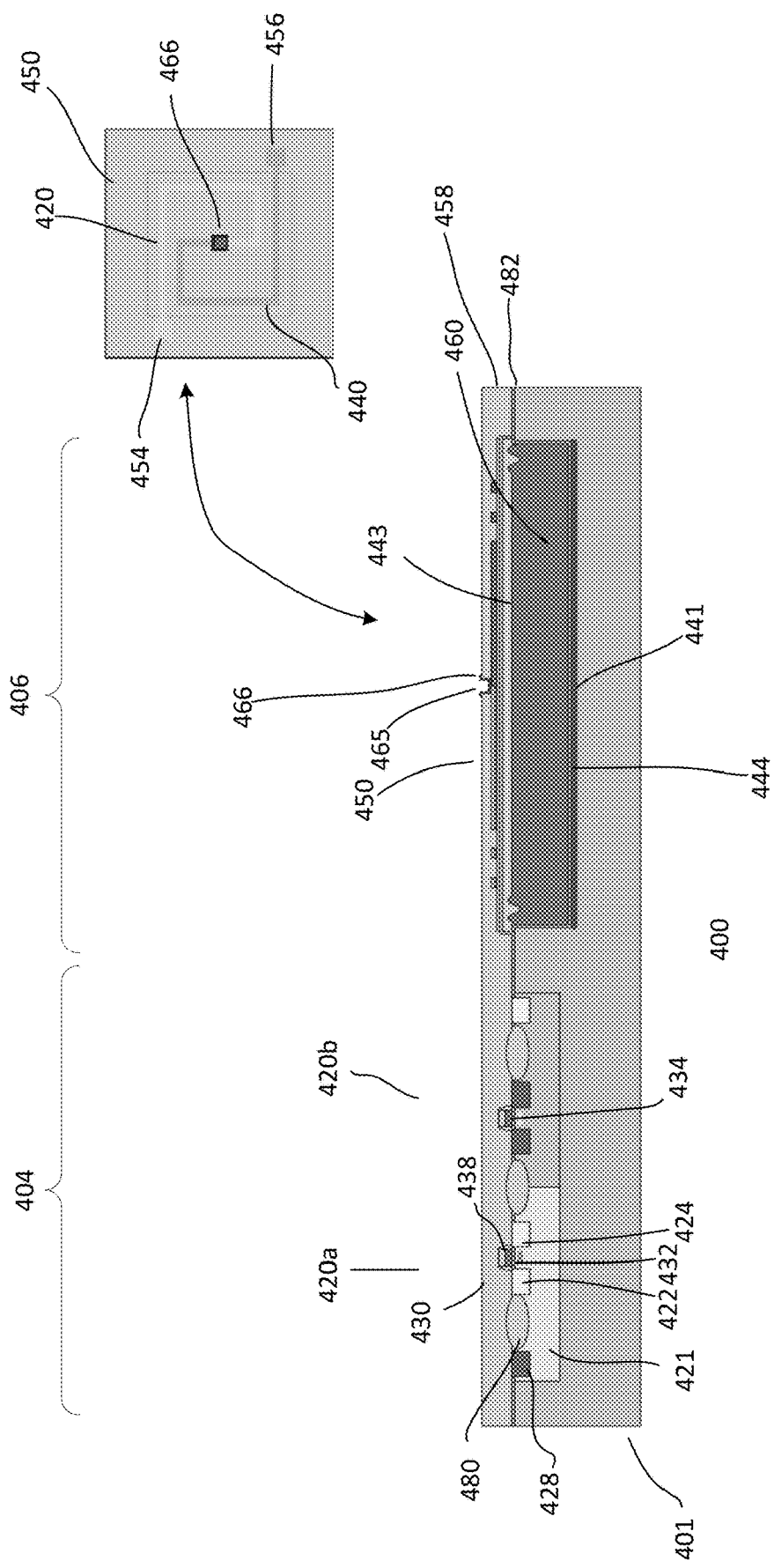

Referring to FIG. 4f, a thermocouple contact 466 is formed to couple the first and second segments of the line structure. For example, the contact forms a thermo-coupler, coupling the line segments of the sensor, as illustrated by the cross-sectional view of top view of the sensor region. Forming the contact may include forming a via opening in the dielectric layer. The via opening exposes the first and second line segments. A metal contact layer is deposited on the substrate. The metal contact layer, for example, may be titanium (Ti) or aluminum (Al). The metal layer is patterned to form the contact. As shown, the contact lines the via opening and covers a portion of the top surface of the dielectric layer adjacent to the via opening.

Figure 4G:
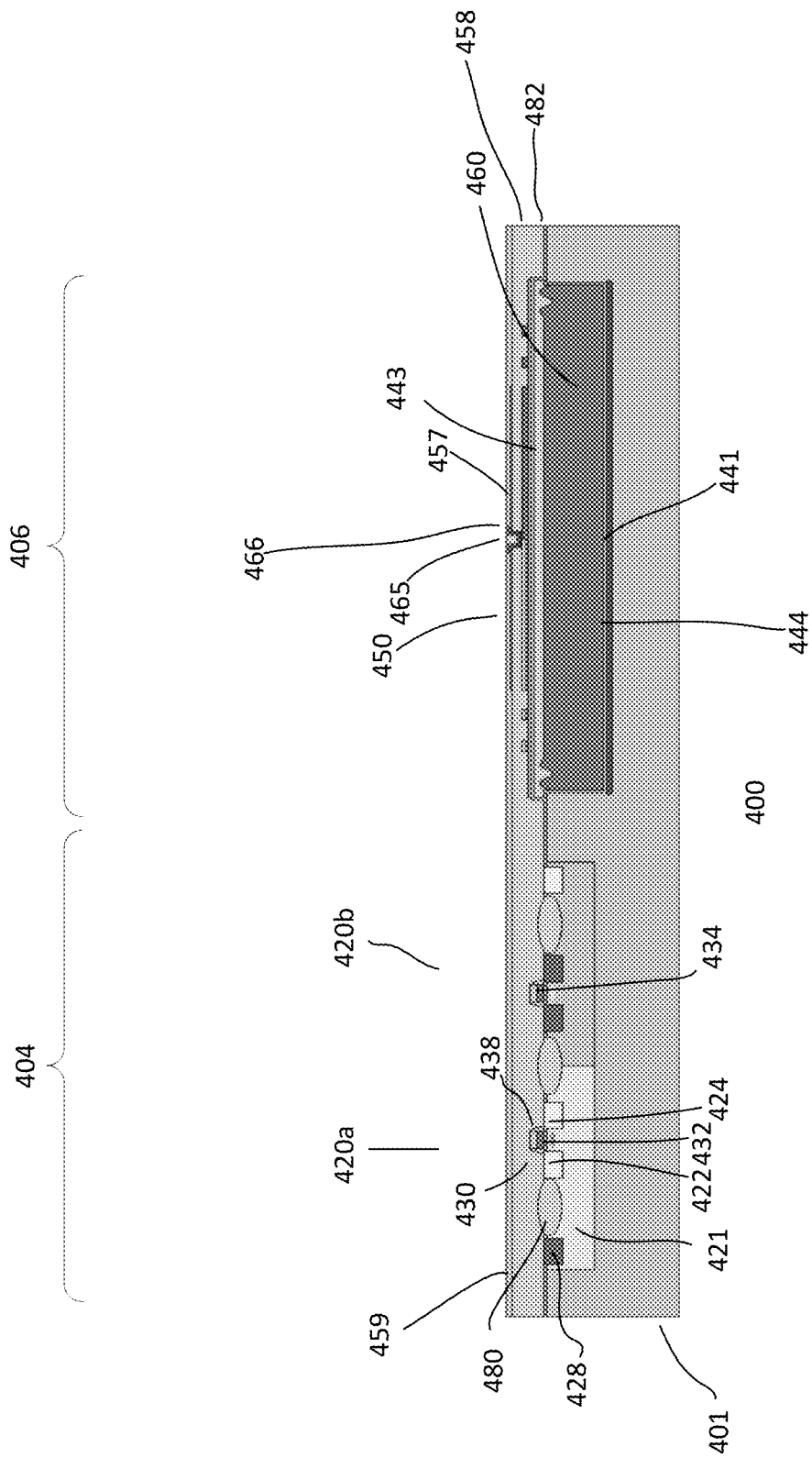
Figure 4H:
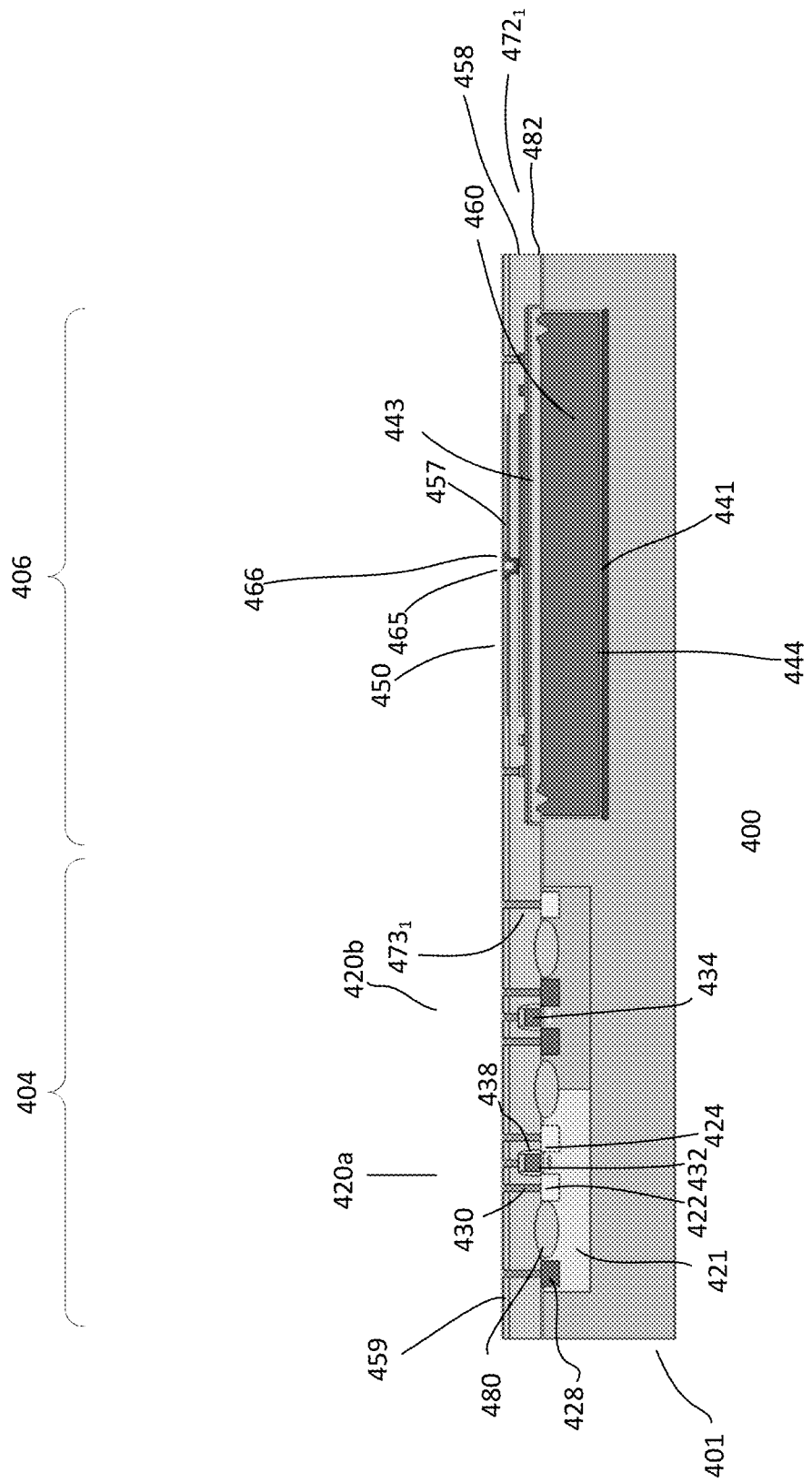

In FIG. 4g, an absorber layer is formed on the substrate. The absorber layer covers the dielectric layer and the thermo-coupler. In one embodiment, the absorber layer is a TiN or NiCr absorber layer. Other types of absorber layers may also be useful. The absorber layer may be formed by, for example, sputtering. The absorber layer may be formed using other techniques. In one embodiment, for example, the thickness of the absorber is adjusted to form a layer having a sheet resistance of about 377 Ohm/sq. Providing any other thicknesses and sheet resistances for the absorber may also be useful. The absorber layer is patterned to form an absorber 457 over the thermopile structure in the sensor region. Patterning the absorber may be achieved by mask and etch techniques.

A second dielectric layer 459 is formed over the substrate, the dielectric layer covers the absorber and the first dielectric layer 458. The second dielectric layer, for example, is silicon oxide formed by CVD. The second dielectric layer 459 serves as the upper portion of the first via layer of the first ILD level of the BEOL dielectric.

As described, a single line structure is formed. The process can be employed to form multiple line structures stacked and coupled in series to form stacked line structures, such as described in FIG. 3d. For example, additional line structure layers, doping, dielectric layers and dopant implants may be performed. In addition, an array of line structures or stacked line structures may be formed to provide an array of sensors, as described in FIG. 3e. Forming other types of MEMS structures may also be useful.

The process continues to perform back-end-of-line (BEOL) processing. As shown, in FIG. 4h, the BEOL process includes forming contacts 473 in the first and second dielectric layers 458 and 459. The first and second dielectric layers, for example, serve as the first via dielectric layer 472 of the first dielectric level of the BEOL dielectric layer. The contacts are coupled to the various terminals in the CMOS and sensor regions. For example, the contacts are coupled to the S/D regions, gates and well contacts. In addition, contacts 473 are provided for the MEMS structure or sensor terminals, as shown in the cross-sectional and top views. The contacts may be tungsten contacts. Other types of contacts may also be useful. The contacts, for example, are formed by a single damascene technique. The single damascene technique includes forming vias, filling the vias with a contact layer, and polishing, such as CMP, to remove excess contact material. Forming contacts using other techniques may also be useful.

Figure 4I:
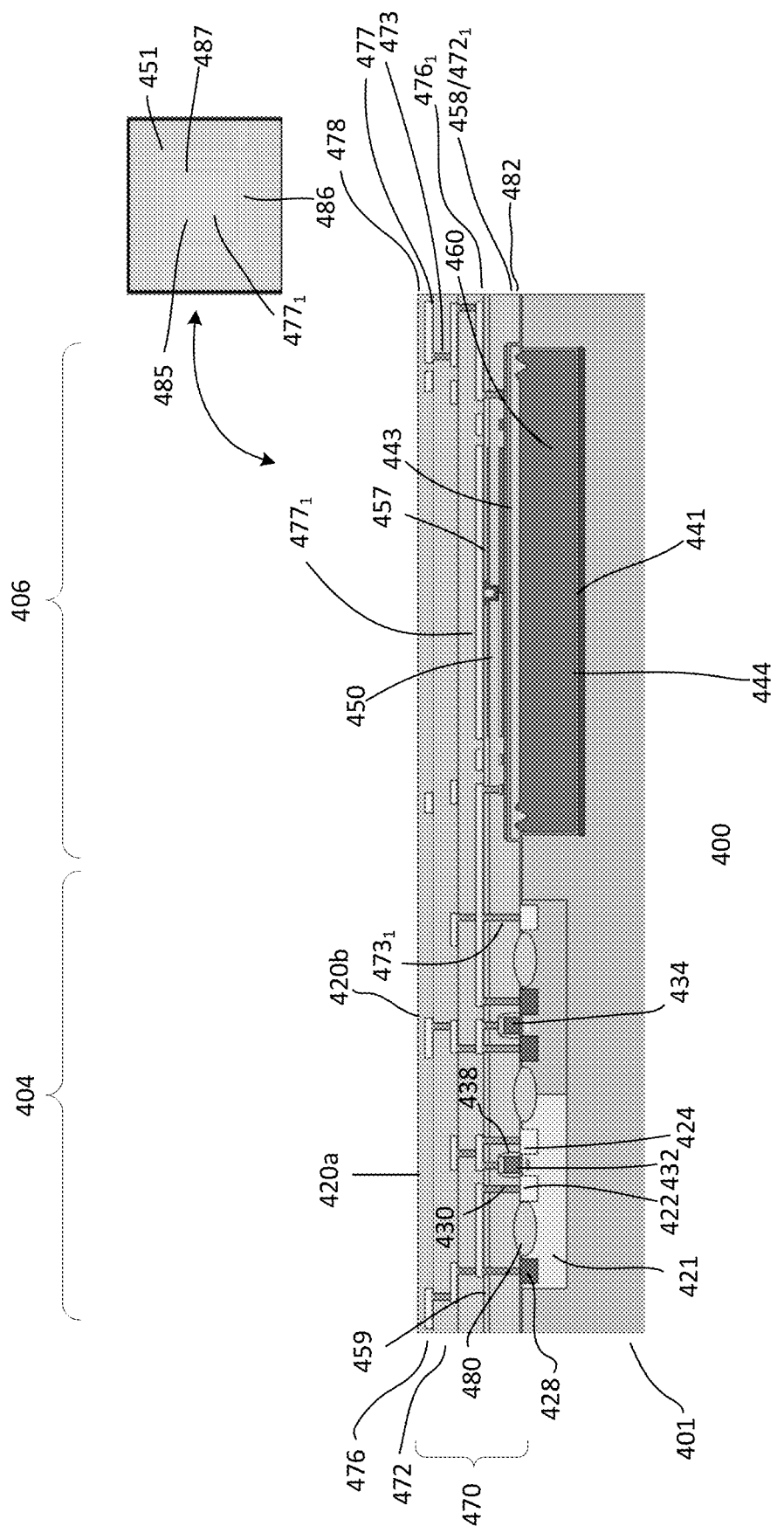

In FIG. 4i, BEOL processing continues. In one embodiment, the BEOL dielectric 470 with ILD levels are formed. For example, the first metal level 476 of the first ILD level, as well as additional ILD levels, are formed. As discussed, a via level includes via contacts and a metal level includes metal lines. The metal lines and vias form interconnections of the device. As shown, the BEOL dielectric includes 3 ILD levels. Other numbers of ILD levels may be provided for the BEOL dielectric. A passivation layer 478 is formed over the upper most metal or pad level. The passivation layer, for example, is silicon nitride. In some embodiments, the passivation layer may be a passivation stack having multiple passivation layers. For example, the passivation stack may include silicon oxide and silicon nitride layers. Other types of passivation layers may also be useful. The passivation layer may be formed by CVD.

The pattern of the metal lines 477 in the first metal level 476 is also configured to define the geometry of the thermopile structure in a thermopile region 450 of the sensor region. The thermopile region excludes the terminal portions of the line or thermopile structure. In one embodiment, as shown in the top view, the metal line pattern 477 in the thermopile region protects a central portion 485 of the thermopile region as well as the line structure 486 on sides of the thermopile region. A gap 487 is provided in the metal line pattern between the line structure at the sides and the central portion. As for the metal lines in the upper metal line levels, they are configured to shape the profile of an upper sensor cavity above the sensor. For example, the metal serves as an etch stop layer for patterning the dielectric material of the BEOL dielectric.

Figure 4J:
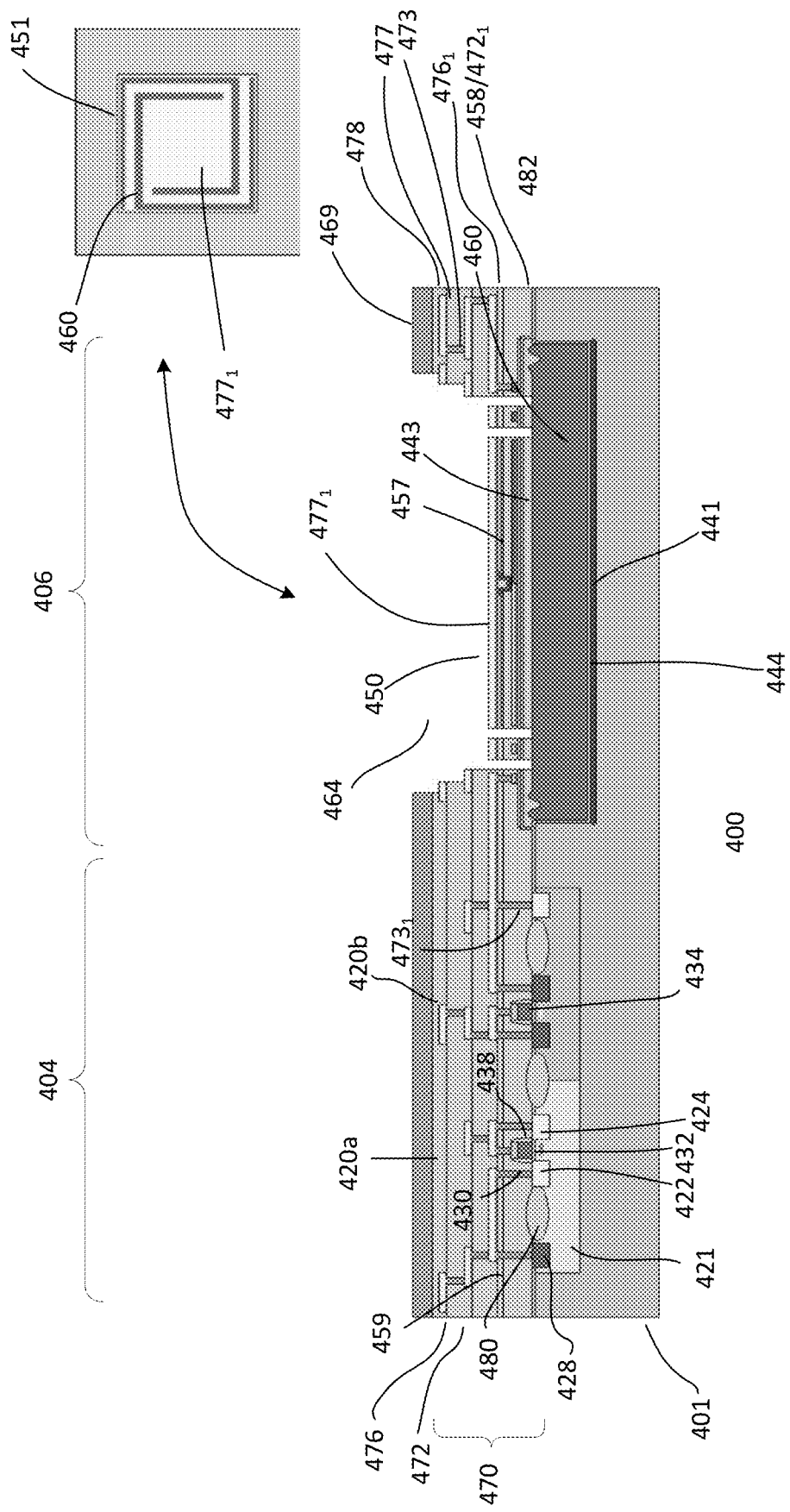

Referring to FIG. 4j, the BEOL dielectric is patterned to form an upper sensor cavity 464 over the sensor. In one embodiment, an etch mask 469, such as a photoresist layer, is formed over the BEOL dielectric. The photoresist layer is patterned to provide an opening to expose the sensor region. A RIE is performed to etch the BEOL dielectric layer. The etch is selective to the metal of the metal levels. The etch removes portions of the dielectric material that are exposed or unprotected by the etch mask, forming the upper sensor cavity. As described, the metal lines of the different levels are configured to form the profile of the upper cavity as well as the thermopile geometry. As shown, the cavity includes a stepped profile which tapers in from top to bottom. Other types of cavity profiles may also be useful. Due to the pattern of the metal lines 477 in the first metal level, as shown in the cross-sectional and top views, the dielectric material exposed is removed to expose the sacrificial fill 460 in the lower sensor cavity.

Figure 4K:
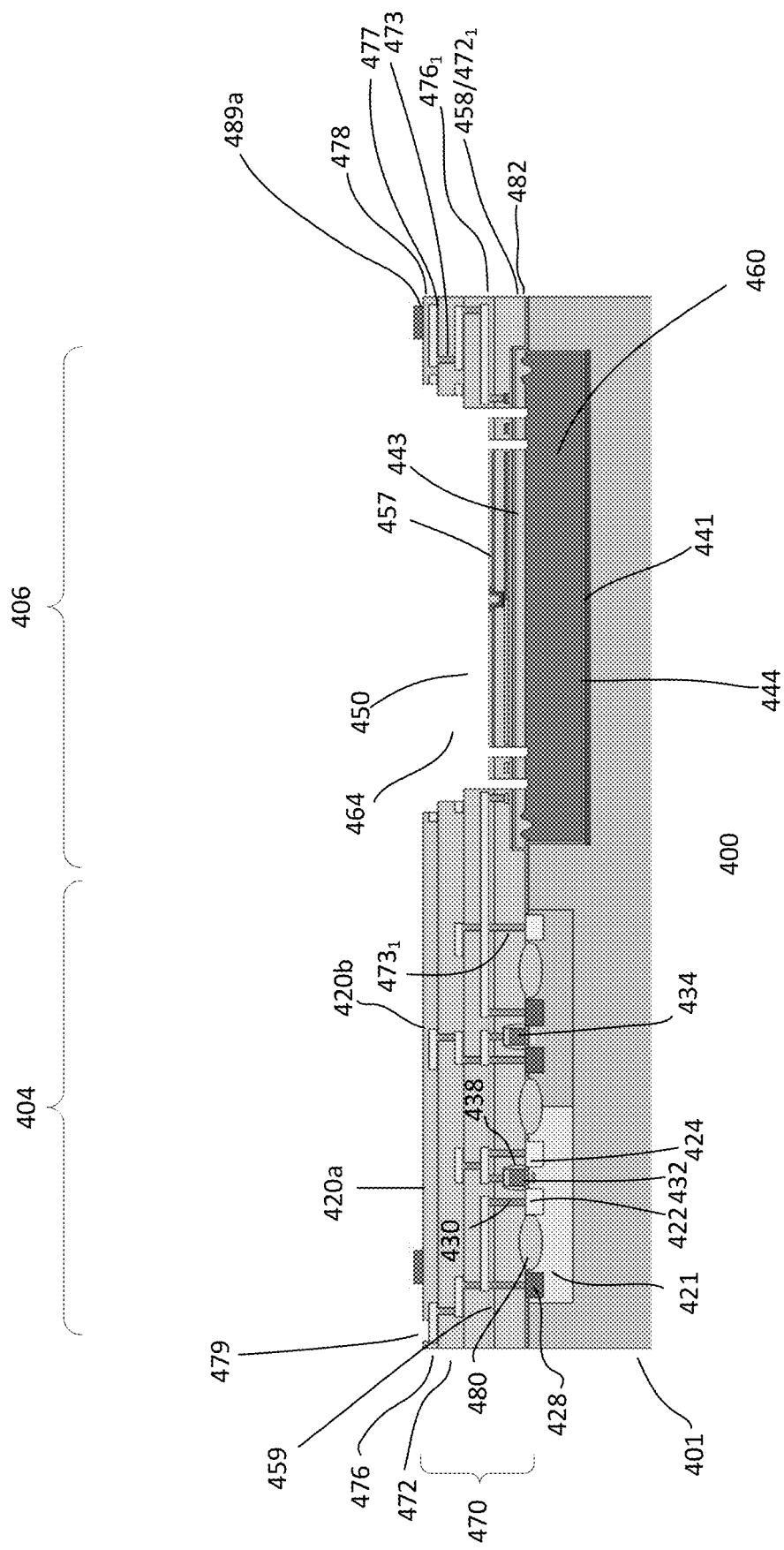
Figure 4I:
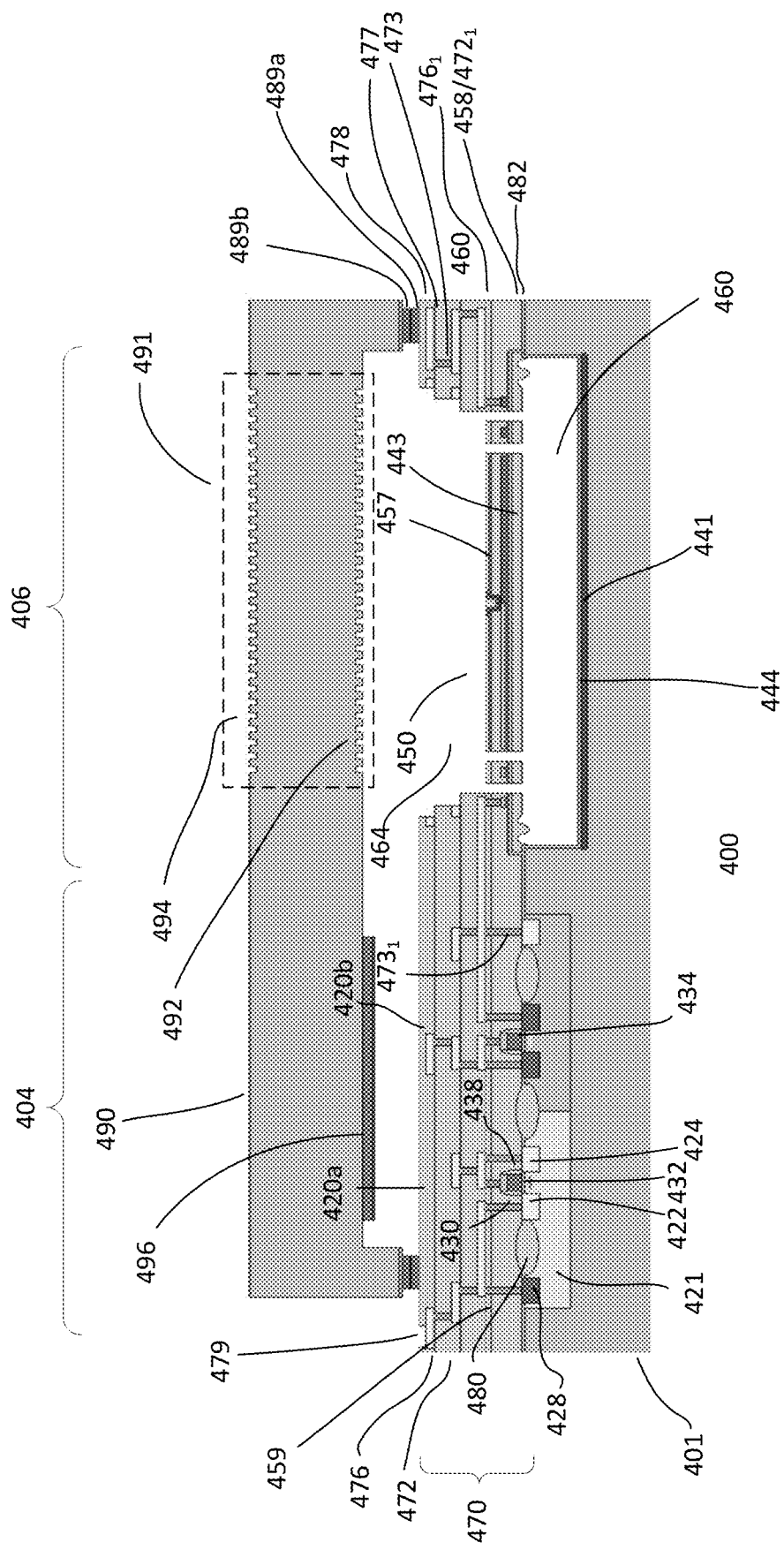

As shown in FIG. 4k, pad openings 479 are formed in the passivation layer, exposing bond pads in the uppermost metal or pad level. To form pad openings, mask and etch processes may be used. A bottom sealing ring 489a is formed on the BEOL dielectric. For example, the bottom sealing ring is formed surrounding the device. The sealing ring is formed by, for example, a lift-off process. Providing other formation techniques such as evaporation or sputtering may also be useful. The sealing ring facilitates subsequent bonding with a cap by thermal compression. The sealing ring may be a gold-based sealing ring, such as gold or gold-tin. Providing any other materials, such as copper (Cu), aluminum (Al), germanium (Ge), may also be useful.

Referring to FIG. 4l, the substrate is subjected to a release process. The release process removes the sacrificial fill in the lower cavity. This forms the lower sensor cavity between the reflector and sensor. In one embodiment, a dry etch is performed to remove the sacrificial fill. The etchant etches the sacrificial layer with a high etch rate compared to the metal and the dielectric material of the BEOL dielectric layer, as well as the protective layer over the reflector. For example, the etchant is highly selective to metal and silicon oxide. In one embodiment, a xenondifluoride ($XeF_2$) etchant is employed for the release process. In another embodiment, isotropic sulfur hexafluoride ($SF_6$) etchant is used as an alternative etchant to XeF$_2$. Other types of etchants or etch processes may also be useful.

The process continues with the packaging of the device. As shown, a cap 490 is bonded to the substrate. For example, a cap sealing ring 489*b* on the cap is bonded to the substrate sealing ring on the substrate. In one embodiment, thermal compression is used to bond the cap to the substrate. The cap may be bonded at the wafer level (wafer level vacuum packaging). For example, the cap is bonded prior to dicing the wafer to separate the devices. The cap, in one embodiment, is formed of a material transparent to infrared radiation. For example, the cap is capable of transmitting infrared radiation to the sensor. The cap, for example, may be a silicon cap. Other types of materials which transmit infrared radiation may also be useful.

In one embodiment, the cap includes an anti-reflective region 491. The anti-reflective region facilitates transmission of infrared radiation through the cap. In one embodiment, the anti-reflective region includes bottom grating 492 on the inner (bottom) surface of the cap and top grating 494 on the outer (top) surface of the cap. The gratings can have a moth-eye grating pattern or structure to facilitate transmission of infrared radiation. Other grating patterns for the gratings may also be useful.

In one embodiment, the anti-reflective region includes anti-reflection coatings disposed on the front and back sides of the cap. Materials with different reflective index may be deposited alternatively on the surfaces of the anti-reflective region. For example, materials for the anti-reflection coating may be zinc sulfide or germanium (Ge) and deposited in the same manner as the moth-eye grating pattern or structure. Providing any other materials and deposition techniques for the anti-reflective coating may also be useful.

In one embodiment, a getter 496 is disposed on the inner surface of the cap. The getter absorbs moisture and outgassing within the encapsulated device. The getter, for example, may be zirconium alloys, titanium (Ti), nickel (Ni), aluminum (Al), barium (Ba) or magnesium (Mg). Other types of getter materials such as rare earth element including cerium (Ce) or lanthanum (La) may also be useful. The getter facilitates maintenance of the vacuum, improving reliability. Alternatively, the cap may be similar to the cap of FIG. 2. The process continues to complete the device. For example, connections or bonds are formed which connects to the bond pads to provide access to internal components of the device.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a substrate prepared with a complementary metal oxide semiconductor (CMOS) region and a sensor region;
   forming a substrate cavity in the substrate in the sensor region, the substrate cavity includes cavity sidewalls and cavity bottom surface;
   forming a sacrificial material in the substrate cavity, wherein the sacrificial material fills the substrate cavity;
   forming a dielectric membrane over the substrate cavity;
   forming a dielectric membrane over the substrate cavity;
   forming CMOS devices in the CMOS region;
   forming a micro-electrical mechanical system (MEMS) component on the membrane;
   forming a back-end-of-line (BEOL) dielectric disposed on the substrate having a plurality of interlayer dielectric (ILD) layers, wherein the BEOL dielectric comprises an opening to expose the MEMS component, wherein the opening forms a BEOL cavity above the MEMS component; and
   removing the sacrificial material in the substrate cavity.

2. The method of claim 1, wherein forming the substrate cavity comprises:
   etching the substrate to form the substrate cavity with the cavity sidewalls and the cavity bottom surface;
   forming a reflector on the substrate cavity bottom surface;
   filling the substrate cavity with the sacrificial material; and
   forming the membrane, wherein the membrane covers the sacrificial material and the substrate cavity.

3. The method of claim 2, wherein forming the membrane comprises:
   forming a dielectric layer on the substrate covering the substrate cavity and the sacrificial material; and
   patterning the dielectric layer to leave the dielectric layer covering the sacrificial material and the substrate cavity.

4. The method of claim 2 further comprises:
   etching the BEOL dielectric in the sensor region to form the BEOL cavity which exposes the MEMS component;
   patterning the sensor region and the membrane to form release openings; and
   removing the sacrificial material in the substrate cavity by an etch through the release openings to expose the reflector on the cavity bottom surface.

5. The method of claim 1, wherein forming the MEMS component comprises forming a thermopile sensor.

6. The method of claim 1, wherein forming the MEMS component comprises forming an array of thermopile sensors.

7. The method of claim 1, wherein forming the BEOL dielectric comprises:
   forming a first contact dielectric layer on the substrate, the first contact dielectric layer covering the CMOS devices in the CMOS region and the MEMS component in the sensor region; and
   forming CMOS contacts coupled to CMOS contact regions in the CMOS region and sensor contacts coupled to sensor contact regions in the sensor region, wherein the first contact dielectric layer serves as a first contact level.

8. The method of claim 7 further comprises:
   forming a first metal level, wherein forming the first metal level includes forming a first metal level dielectric with first metal interconnects, wherein the first metal interconnects and the first metal level dielectric have coplanar top surfaces, wherein the first contact level and the first metal level serve as a first interlevel dielectric (ILD) level; and
   forming at least one additional ILD level over the ILD level, wherein the additional ILD level includes an additional metal level with metal lines over an additional via contact level with contacts coupled to the metal lines of the additional metal level and metal lines of the first metal level.

9. The method of claim 7 further comprises:
   forming a first metal level, wherein forming the first metal level includes forming a first metal level dielectric with first metal interconnects, wherein the first metal interconnects and the first metal level dielectric have coplanar top surfaces, wherein the first contact level and the first metal level serve as a first ILD level; and forming y ILD levels over the first ILD level, where y is from 2 to T, where T is equal to y+1 and serves as a top metal level, wherein an $i^{th}$ ILD level includes an $i^{th}$ via contact level dielectric layer with $i^{th}$ via contacts below an $i^{th}$ metal level dielectric layer with $i^{th}$ metal lines.

10. The method of claim 9 further comprises:
forming a pad dielectric layer over the top metal level, wherein the top metal level serves as a pad metal layer with pads; and
forming pad openings in the pad dielectric layer to expose the pads.

11. The method of claim 1 further comprises bonding a cap to the substrate to seal the CMOS and the sensor region.

12. The method of claim 11, wherein the cap comprises:
a material which can transmit infrared radiation; and
a cap sealing ring, wherein the cap sealing ring is configured to mate with a BEOL sealing ring to seal the CMOS and the sensor region.

13. The method of claim 12, wherein the cap comprises an anti-reflective region with anti-reflection coatings disposed on front and back sides of the cap in the sensor region, wherein the anti-reflective region includes a bottom grating on an inner surface of the cap and a top grating on an outer surface of the cap.

14. The method of claim 13, wherein the cap comprises a getter disposed on the inner surface of the cap other than in the sensor region.

15. The method of claim 1, wherein forming the BOEL dielectric comprises forming metal and via levels, the metal levels include metal lines and the via levels include via contacts for interconnecting the components of the device.

16. The method of claim 15, wherein:
the metal lines of the metal levels include cavity metal lines which are configured to define the BEOL cavity over the MEMS component; and
the metal lines of a first metal level of the BEOL dielectric are configured to define a geometry of the MEMS component.

17. The method of claim 1, wherein forming the CMOS devices in the CMOS region comprises:
forming transistor wells;
forming isolation regions;
forming gates of the CMOS devices, wherein forming the gates includes
providing a gate dielectric layer over the substrate,
disposing a polysilicon layer over the gate dielectric layer, and
patterning the gate dielectric layer and the polysilicon layer in the CMOS region to form the gates;
forming source/drain (S/D) regions and extension regions adjacent to the gates; and
disposing a spacer dielectric layer over the substrate, wherein the spacer dielectric layer is etched to form spacers on sidewalls of the gates.

18. The method of claim 17, wherein:
the gate dielectric layer in the sensor region serves as an additional protective liner; and
the polysilicon layer in the sensor region is patterned to form a thermopile line structure of the MEMS component which comprises a thermopile sensor.

19. A method for forming a device comprising:
providing a substrate prepared with a complementary metal oxide semiconductor (CMOS) region and a sensor region;
forming a substrate cavity in the substrate in the sensor region, the substrate cavity includes cavity sidewalls and cavity bottom surface, wherein the cavity bottom surface comprises a reflector;
filling the substrate cavity with a sacrificial material, wherein a membrane is disposed over the substrate cavity;
forming CMOS devices in the CMOS region;
forming a micro-electrical mechanical system (M EMS) component on the membrane, wherein the MEMS component comprises a thermopile sensor;
forming a back-end-of-line (BEOL) dielectric disposed on the substrate having a plurality of interlayer dielectric (ILD) layers, wherein the BEOL dielectric comprises an opening to expose the MEMS component, wherein the opening forms a BEOL cavity above the MEMS component; and
removing the sacrificial material in the substrate cavity.

20. A method for forming a device comprising:
providing a substrate prepared with a complementary metal oxide semiconductor (CMOS) region and a sensor region;
forming a substrate cavity in the substrate in the sensor region, the substrate cavity includes cavity sidewalls and cavity bottom surface, wherein the cavity bottom surface comprises a reflector;
filling the substrate cavity with a sacrificial material, wherein a membrane is disposed over the substrate cavity;
forming CMOS devices in the CMOS region;
forming a micro-electrical mechanical system (M EMS) component on the membrane, wherein the MEMS component comprises a thermopile sensor;
forming a back-end-of-line (BEOL) dielectric disposed on the substrate having a plurality of interlayer dielectric (ILD) layers, wherein the BEOL dielectric comprises an opening to expose the MEMS component, wherein the opening forms a BEOL cavity above the MEMS component;
removing the sacrificial material in the substrate cavity; and
bonding a cap to the substrate, wherein a cap sealing ring of the cap is configured to mate with a BEOL sealing ring to seal the CMOS and the sensor regions.

* * * * *